(12) United States Patent
Komatsu

(10) Patent No.: US 7,115,891 B2
(45) Date of Patent: Oct. 3, 2006

(54) WAFER MAPPING DEVICE AND LOAD PORT PROVIDED WITH SAME

(75) Inventor: Shoji Komatsu, Kannabe-cho (JP)

(73) Assignee: Rorze Corporation, Hiroshima (JP)

(*) Notice: Subject to any disclaimer, the term of this patent is extended or adjusted under 35 U.S.C. 154(b) by 0 days.

(21) Appl. No.: 10/489,674

(22) PCT Filed: Sep. 17, 2002

(86) PCT No.: PCT/JP02/09524

§ 371 (c)(1),
(2), (4) Date: Sep. 13, 2004

(87) PCT Pub. No.: WO03/026003

PCT Pub. Date: Mar. 27, 2003

(65) Prior Publication Data

US 2004/0262548 A1   Dec. 30, 2004

(30) Foreign Application Priority Data

Sep. 17, 2001  (JP) ............................. 2001-281909

(51) Int. Cl.
*G01V 8/00* (2006.01)
*B65G 65/18* (2006.01)
*B65G 1/00* (2006.01)

(52) U.S. Cl. .............. 250/559.4; 414/937; 414/416.03; 414/416.08; 414/331.15

(58) Field of Classification Search ............ 250/559.29, 250/559.3, 559.4; 414/331.15, 416.03, 416.08, 414/935, 937, 938
See application file for complete search history.

(56) References Cited

U.S. PATENT DOCUMENTS 6,188,323 B1* 2/2001 Rosenquist et al. ...... 340/686.5

FOREIGN PATENT DOCUMENTS

| JP | 2000036528 A | * | 2/2000 |
| JP | WO 00/22589 | | 4/2000 |
| JP | A 2000-133697 | | 5/2000 |
| JP | A 2002-164411 | | 6/2002 |
| JP | A 2002-353293 | | 12/2002 |

* cited by examiner

*Primary Examiner*—Thanh X. Luu
*Assistant Examiner*—Stephen Yam
(74) *Attorney, Agent, or Firm*—Oliff & Berridge, PLC

(57) ABSTRACT

A wafer mapping device that recognizes the existence of wafers along with the descending and opening of a front door (2a) of a closed type clean container (2) in a state where the front door of the closed type clean container for mounting and housing wafers (4) on any one of or a plurality of shelves among a plurality of internal shelves is made tightly contact to a port door (13) of a load port (12), comprising a swinging member (22) coupled to the port door so as to swing around predetermined horizontal axes parallel to the port door, a pair of sensor portions (20) fixed to the swinging member and mutually separated as well as protruding towards the clean container from the swinging member above the port door, a light emitting device (20a) and light receiving device (20b) fixed one each to the pair of sensor portions and facing each other, and swinging drive means (25) for rotating the swinging member around the horizontal axis to an angle where the wafers enter between the light emitting device and the light receiving device without the light emitting device and the light receiving device contacting the wafers, and inserting the pair of sensor portions into the interior of the clean container.

5 Claims, 21 Drawing Sheets

WAFER MAPPING DEVICE AND LOAD PORT PROVIDED WITH SAME

FIELD OF THE INVENTION

The present invention relates to a wafer mapping device, and load port provided therewith, that recognize wafers mounted on a plurality of shelves provided inside a clean container for housing semiconductor wafers (hereafter referred to as "wafers") used in the manufacturing process of semiconductors, optical discs, liquid crystal displays, and other electronic products, and in particular to a new wafer mapping device and load port provided therewith with respect to a mini-environment system closed type clean container.

BACKGROUND TECHNOLOGY

In the manufacturing process of semiconductor devices and the like, in order to prevent contaminants that lead to short circuits from adhering to very fine electrical circuits on the wafers, the wafers are conveyed while housed in a hermetically sealed state inside a clean container 2 as shown in FIG. 20, to be processed in a clean room. In the drawing, reference numeral 2a indicates a front door of the clean container 2 and 4 indicates wafers, the wafers 4 being housed on a plurality of shelves inside the clean container 2.

Incidentally, when wafers are processed in the clean room, in the prior art the entire clean container is brought to the clean room and, after the front door is opened by hand, the wafers are extracted using a robot or the like prepared separately, and during that extraction, it is necessary to recognize the number of wafers and the positions of shelves where the wafers exist (hereafter referred to as "mapping"), in order to control the robot or the like.

FIGS. 21 and 22 show a wafer treatment device of the prior art; FIG. 21 is a partial cutaway side view of the device, and FIG. 22 is a plan view of the device. In the drawings, reference numeral 1 indicates a stage, and at one side of the stage 1 (the left side in the drawing), a stand 3 on which the clean container 2 is mounted and a wafer mapping device 5 elevating for detecting the wafers 4 inside the clean container 2 on the stand 3 from the outside of the clean container are provided. Also in the drawing, reference numeral 6 is a wafer conveying robot provided on the other side (the right side in FIGS. 21 and 22) of the stage 1, 7 is a control device for the wafer treatment device, and 8 is a wafer processing device for processing wafers 4 extracted from the clean container 2 by the wafer conveying robot 6.

The wafer mapping device 5 herein supports an abbreviated U-shaped arm frame 5a, arranged so that its upper end portions are respectively positioned in the forward and rearward directions (right and left directions in FIGS. 21 and 22) in the center of the left and right directions of the clean container 2 (up and down directions in FIG. 22) with a screw 5c rotated by a motor 5b, provides a light emitting device 5d and light receiving device 5e in the upper end portions of the abbreviated U-shaped arm frame 5a, and, by rotating the screw 5c by means of the motor 5b, elevates the light emitting device 5d and light receiving device 5e on the upper end portions of the arm frame 5a screwed onto the screw 5c between the lower end and upper end (in the lower end position in the drawing) of the clean container 2.

The clean container 2 is normally constructed to house 10 to 25 wafers, and because it is not known on which shelf a wafer 4 is housed, the wafer treatment device firstly performs operations to recode which shelf a wafer 4 is on inside the clean container 2, by means of the wafer mapping device 5. That is, when the clean container 2 is mounted on the stand 3, a control device 7 of the wafer treatment device operates the motor 5b, elevating the arm frame 5a, to which the light emitting device 5d and the light receiving device 5e are attached, from the lowest position to the highest position at a preset speed. During this process, the control device 7 recognizes the positions of wafers 4 by a combination of a difference in the output signal of the light receiving device 5e, which receives a light beam from the light emitting device 5d, between when a wafer 4 intervenes between the light emitting device 5d and the light receiving device 5e and when it does not, and the amount of movement of the arm frame 5a. Then when the arm frame 5a rises to the highest position, the consul device 7 conveys the wafers 4 on specified shelves among the recognized wafers 4 to the wafer processing device 8 by means of the wafer conveying robot 6, and stores, on speed shelves inside the clean container 2, wafers 4 in the wafer processing device 8 whose processing has been completed, by means of the wafer conveying robot 6.

However, with this method, the disadvantages of it being unfavorable to bring the clean container 2 whose exterior is contaminated into the clean room in terms of maintaining cleanliness levels inside the clean room, and that the light beam does not correctly reach the light receiving device 5e if the clean container 2 is light shielded or if it is deformed even if transparent, etc. have occurred.

For this reason, recently, a semiconductor manufacturing process has been proposed in which a high cleanliness area called a mini-environment that separates a given limited section where the wafer processing device 8 is located is provided, and a load port, which is a device for extracting and inserting wafers, is installed at the interface between the high cleanliness area and a middle or a low cleanliness area wherein the clean container 2 presents, the clean container used therein being called a FOUP (Front Opening Unified Pod), standardized under SEMI (Semiconductor Equipment and Materials Intentional) together with the load port, so that semiconductor device manufacturer around the world are in the process of employing this system.

As a wafer mapping device in this mini-environment system, there is, for example, that which is provided in the wafer treatment device load port 12 disclosed in the patent application opened No. 2000-133697 filed by the applicant of the present invention, as shown in FIGS. 23 and 24. FIG. 23 is a partial cutaway side view of the wafer treatment device, and FIG. 24 is a cross sectional view of the wafer treatment device seen from above along the line A—A in FIG. 23. The load port 12 therein is constructed so as to make the port door 13 tightly contact to the front door 2a of the closed type clean container (FOUP) 2 that houses wafers 4 on a plurality of interior shelves and elevate them by means of a ball screw 16b rotatably driven by a servo motor 16a, a pair of sensor portions 14 are attached at both side ends of the upper end surface of the port door 13 so that they are each rotatable 90° horizontally on an axis at one end thereof, the pair of sensor portions 14 opening 90° when the port door 13 and the front door 2a of the clean container 2 contacts tight and descend, a light emitting device 14a and light receiving device 14b provided respectively in the sensor portions 14 enter the front end portion of the clean container 2, and face each other at separated positions from the port door 13, and a control device 7 recognizes wafers 4 based on the output electrical signal of the light receiving device 14b that receives light from the light emitting device 5d.

According to the wafer mapping device of the patent application opened No. 2000-133697, because the light emitting device 14a and light receiving device 14b provided in the sensor portions 14 enter into the front end portion of the clean container 2 and face each other at positions separated from the port door 13 to recognize wafers, if the clean container 2 is light shielded or transparent but deformed, the light from the light emitting device 14a usually arrives correctly at the light receiving device 14b and reliably recognizes wafers 4, but upon further study of this wafer mapping device, the inventor of the present application noticed that there is a point at which improvement is preferred, having found that because the pair of sensors portions 14 each rotate 90° horizontally, there is a possibility that minute contaminants (trash) may be generated and may intrude into the clean container (FOUP) 2, and that for the light from the light emitting device 14a of one sensor portion 14 to be accurately incident on the light receiving device 14b of the other sensor portion 14, the 90° horizontal rotation stopping positions of the sensor portions 14 must both be extremely accurate, so that there is the possibility that after operating for a long time they do not accurately stop at the 90° position.

DISCLOSURE OF THE INVENTION

It is an object of the present invention to provide a device that effectively solves the above problem, and according to the present invention described in Claim 1, a wafer mapping device, that recognizes the existence of wafers along with the descending and opening of a front door of a closed type clean container for mounting and housing wafers on any one of or a plurality of shelves among a plurality of internal shelves in a state where the front door of the closed type clean container is made tightly contact to a port door of a load port, is characterized in that the wafer mapping device comprises a swinging member coupled to the port door so as to be swingable around a predetermined horizontal axis parallel to the port door, a pair of sensor portions fixed to the swinging member and mutually separated as well as protruding towards the clean container from the swinging member above the port door, a light emitting device and light receiving device fixed one each to the pair of sensor portions and facing each other, and swinging drive means for rotating the swinging member around the horizontal axis to an angle where the wafers enter between the light emitting device and the light receiving device without the light emitting device and the light receiving device contacting the wafers, and inserting the pair of sensor portions into the interior of the clean container.

In the wafer mapping device, when the front door of the closed type clean container for mounting and housing wafers on any one of or a plurality of shelves among a plurality of internal shelves descends and opens in a state where it is contacted tightly against the port door of the load port, along with that, the swinging drive means rotates the swinging member coupled to the port door and swingable around a predetermined horizontal axis parallel to the port door around the horizontal axis to the angle at which the wafers enter between the light emitting device and the light receiving device without the light emitting device and light receiving device, which are respectively fixed facing each other to the pair of sensor portions that protrude from the swinging member toward the clean container at the position above the port door fixed to the swinging member and are separated from each other, contacting the wafers inside the clean container, and inserts the pair of sensor portions and consequently the light emitting device and light receiving device fixed thereto into the interior of the clean container.

Consequently, according to the wafer mapping device of the present invention, because the light emitting device and light receiving device provided in the pair of sensor portions fixed to the swinging member enter the inside of the clean container and recognize wafers by facing each other in positions separated from the port door, the light from the light emitting device to the light receiving device consistently arrives correctly and the wafers can be accurately recognized even when the clean container is light shielded or is transparent but deformed. In addition, according to the wafer mapping device of the present invention, because it is enough for the swinging member to which the pair of sensor portions are fixed to be swung to a small angle, the possibility that minute contaminants (trash) are generated and enter the clean container (FOUP) can be mostly or entirely eliminated, and even if minute contaminants for example are generated in a movable portion such as a spindle having the horizontal axis of the port door, because the spindle can be disposed below the port door, contaminants generated therein fall below the spindle due to the high cleanness flow from the mini-environment, which is the high cleanliness area of positive pressure located on the opposite side to the clean container with respect to the port door, and cannot enter the inside of the clean container. Also, because the pair of sensor portions are both integrally fixed together via the swinging member, the light from the light emitting device of one of the sensor portions can continuously and accurately enter the light receiving device of the other sensor portion even during long term operation.

The wafer mapping device of the present invention, as described in Claim 2, may comprise projection detection means for detecting objects that project from the main body of the clean container, having a light emitting device fixed to one of a top part of the port door or adjacent member thereto, for example in the top portion of the window frame (head frame portion) of the load port frame or the like, and an under part of the port door or adjacent member thereto, for example the support member of the port door of the load port or the like, and a light receiving device fixed to the other of a top part of the port door or adjacent member thereto and an under part of the port door or adjacent member thereto. If so, when the front door is extracted from container main body of the clean container in a state where the front door is tightly contacted to the port door of the load port, if there are objects such as wafers and the like emerging from the clean container the light path between the light emitting device and light receiving device is interrupted and the existence of those objects can be detected, therefore subsequent operations such as lowering the front door and wafer extraction can be stopped and damage to the load portion, wafers, and clean container can be prevented.

Also, according to the present invention described in Claim 3, a load port that lowers and opens, in a state where it is tightly contacted to the port door, the front door of the closed type clean container that houses one or more wafers mounted on one or a plurality of shelves among a plurality of internal shelves, and that is provided with the wafer mapping device that, along with lowering the front door in a state where it is tightly contacted to the port door, recognizes the existence of the wafers, is characterized in that the wafer mapping device is that described in Claim 1 or Claim 2.

By means of the load port in question, the actions of the wafer mapping device of the present invention described above can be produced and the effects of the wafer mapping device of the present invention described above can be brought about.

The load port of the present invention, as described in Claim 4, may also be provided with front door detachably fixing means for engaging/disengaging the front door with/from the man body of the clean container, and fixing the front door in a releasable tightly contacted state with the port door, container main body reciprocatingly moving means for advancing/retracting the main body of the container with respect to a window member of the frame of the load port, and port door elevating means for elevating the port door to which the front door is tightly contacted and fixed, for opening and closing the front door of the clean container. If so, a load port structure in which, after the front door of the clean container is disengaged from the container main body, lowered in a tightly contacted state with the port door and opened, and the wafers extracted and inserted with respect to the container main body, the front door of the clean container and port door are raised in a tightly contacted state, after which the front door is engaged with the container main body to close, can be easily realized.

PREFERRED MODE OF THE INVENTION

Figure 1:
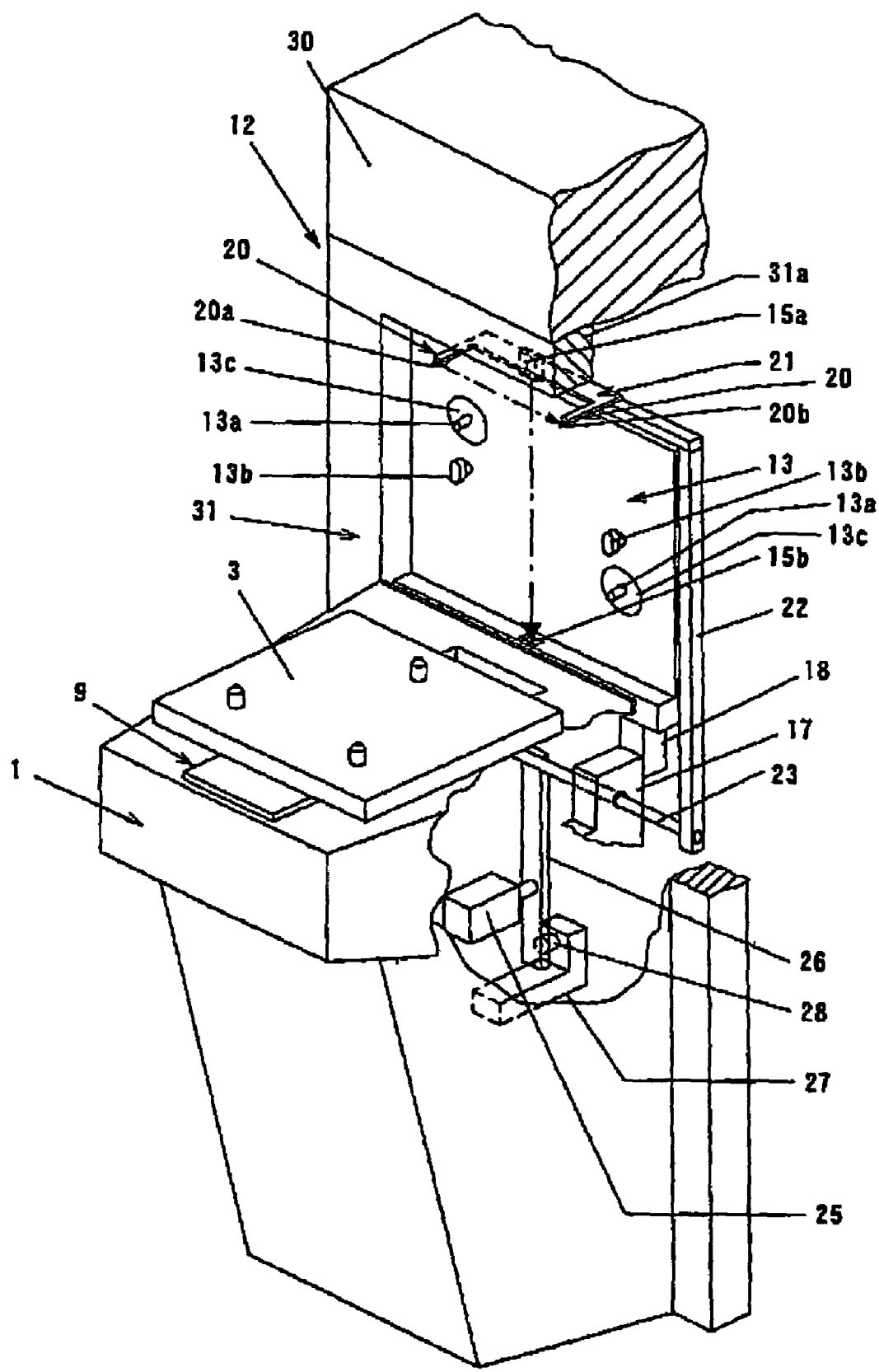
FIG. 1 is a partial cutaway perspective view showing an embodiment of the load port of the present invention, provided with an embodiment of the wafer mapping device of the present invention.

Hereinafter, an embodiment in accordance with the present invention will be explained in detail based on the drawings. FIG. 1 is a partial cutaway perspective view showing an embodiment of the load port in accordance with the present invention, provided with an embodiment of the wafer mapping device in accordance with the present invention, FIG. 2 is a partial cutaway side view of a wafer treatment device provided with the load port of that embodiment, FIG. 3 is a cross sectional view of the wafer treatment device seen from above along the line B—B of FIG. 2, and FIG. 4 is a perspective view showing the wafer mapping device of, the above embodiment, the same parts in these drawings as in the prior art example shown in FIGS. 23 and 24 being indicated by the same reference numerals.

Figure 2:
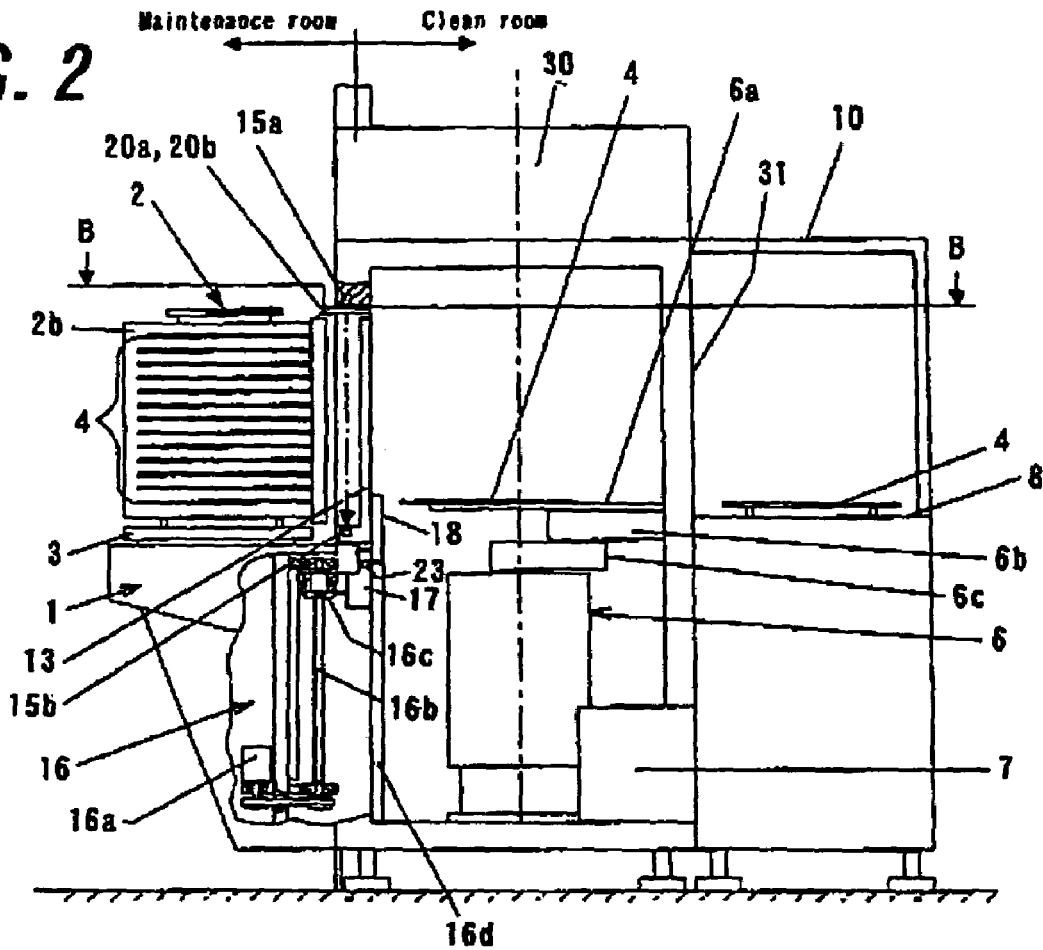
FIG. 2 is a partial cutaway side view of a wafer treatment device provided with the load port of the above embodiment.
Figure 3:
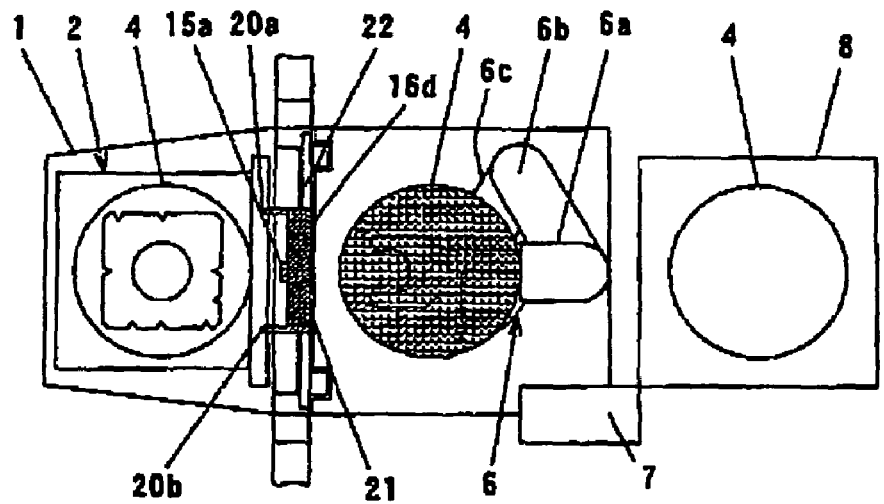
FIG. 3 is a cross sectional view of the wafer treatment device seen from above along line B—B of FIG. 2.
Figure 4:
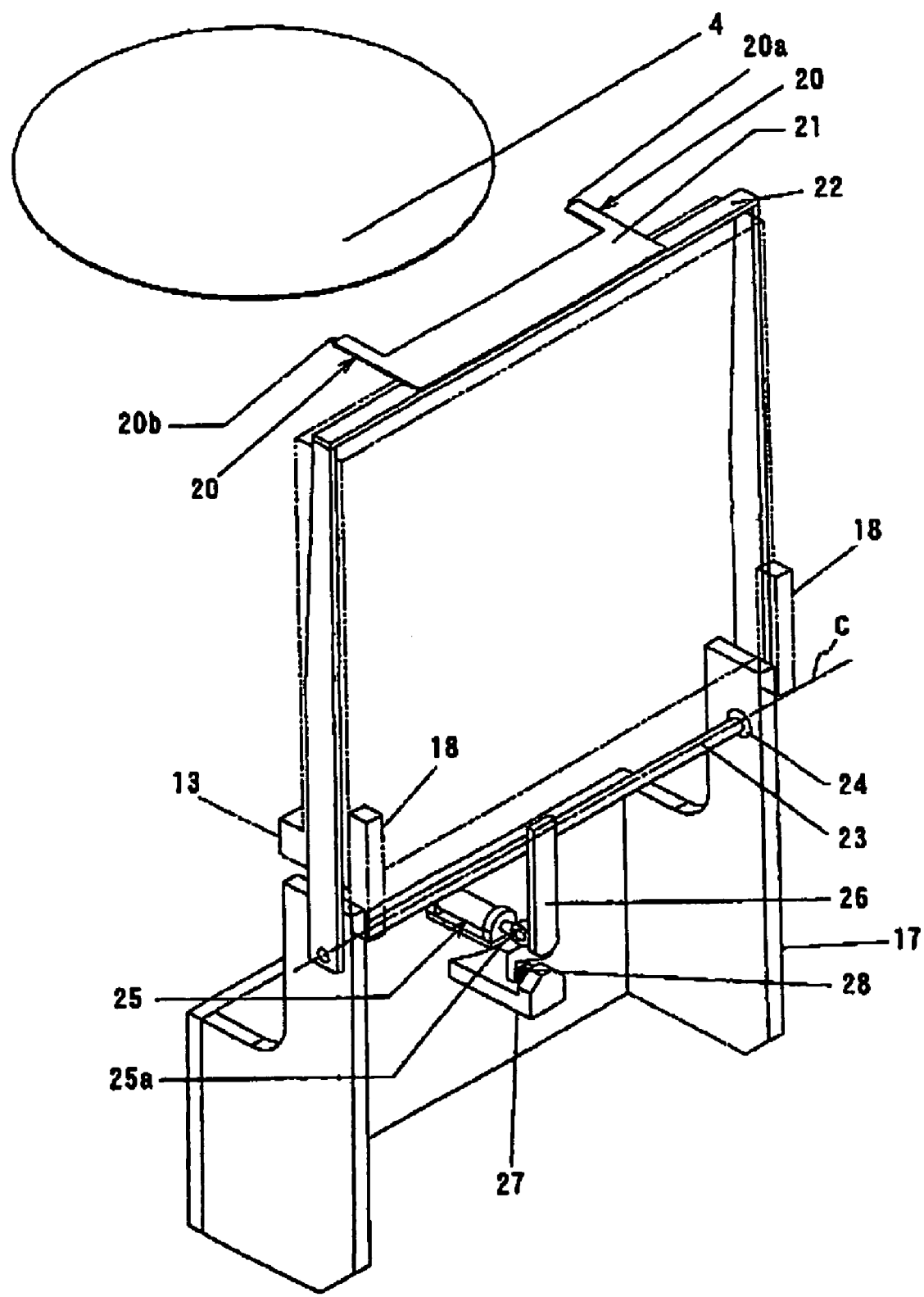
FIG. 4 is a perspective view showing the wafer mapping device of the above embodiment seen from the wafer conveying robot side.
Figure 23:
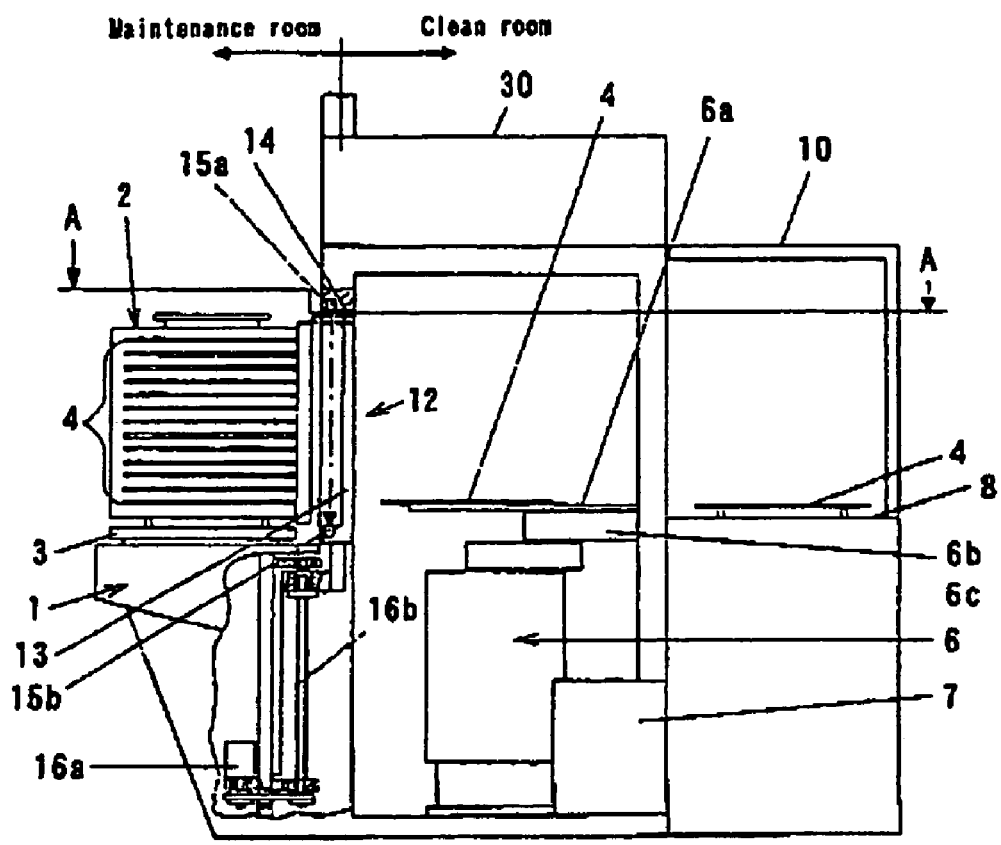
FIG. 23 is a schematic side view showing a prior art wafer treatment device provided with a load port.

As shown in FIGS. 1 to 3, the wafer treatment device therein, similarly to the prior art example shown in FIGS. 23 and 24, is a mini-environment system provided with a high cleanliness area called a mini-environment inside a cover 10 by surrounding and separating a section where a wafer conveying robot 6 and wafer processing device 8 are located and providing a fan filter unit 30 to the section, and equipped with the load port 12 of the above embodiment, which is a wafer extraction/insertion device, at the interface between the high cleanliness area and the middle or low cleanliness area wherein the clean container 2 presents, and as well as a normal control device having a micro computer, not shown in the drawings, being provided for each of the wafer conveying robot 6 and the load port 12, a normal control device 7 having a microcomputer is provided as a superior control device for controlling these control devices.

Figure 20:
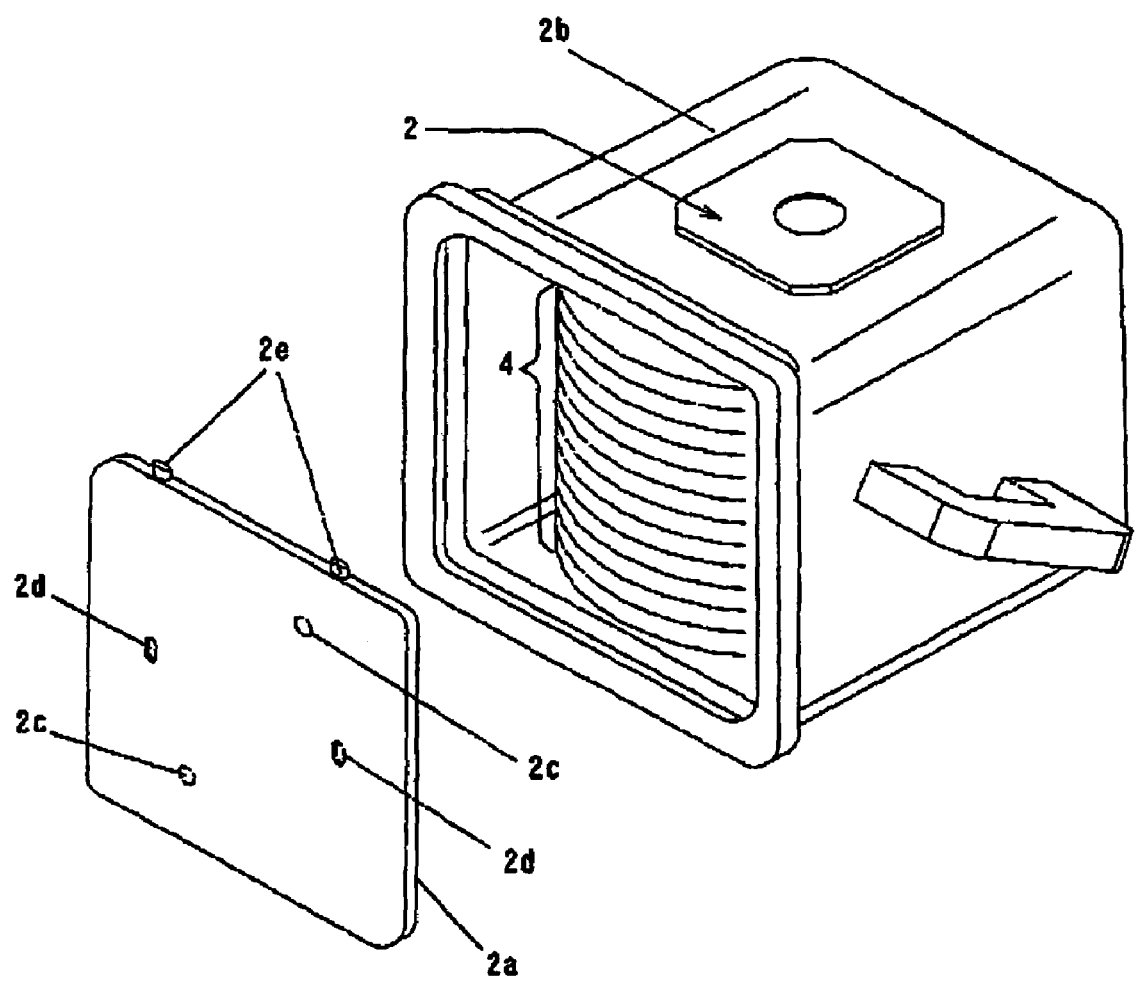
FIG. 20 is a perspective view showing a closed type clean container (FOUP) in a state wherein the font door is disengaged from the clean container.
Figure 21:
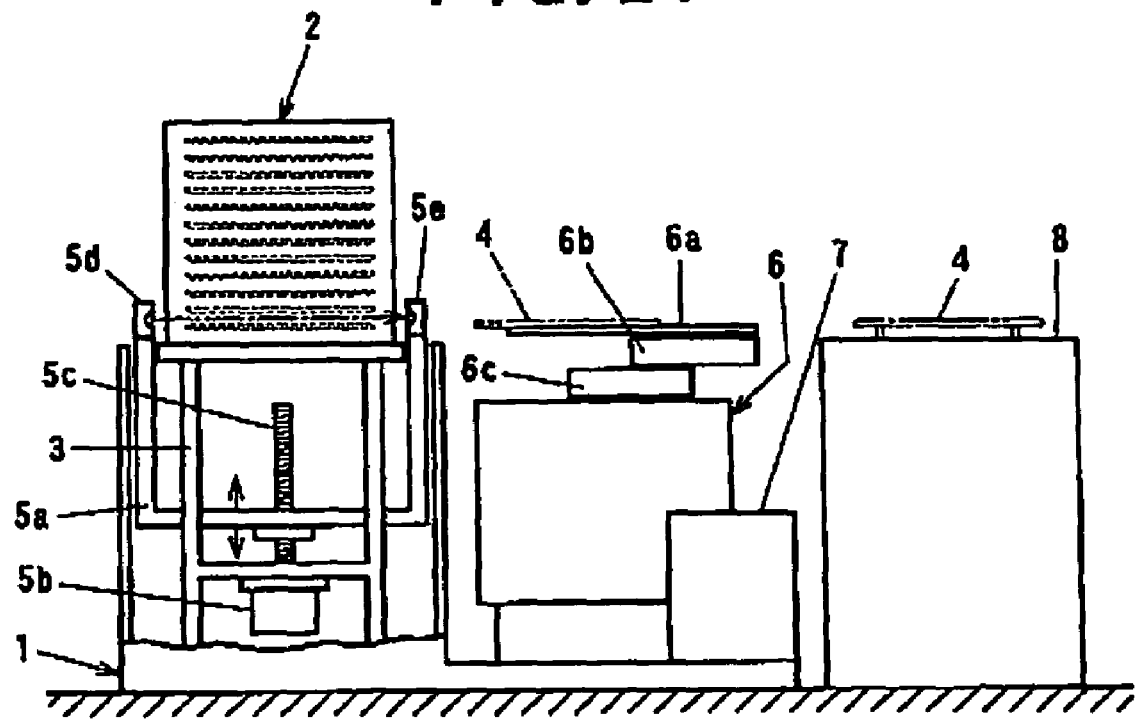
FIG. 21 is a schematic side view showing a prior art wafer treatment device not provided with a load port.
Figure 22:
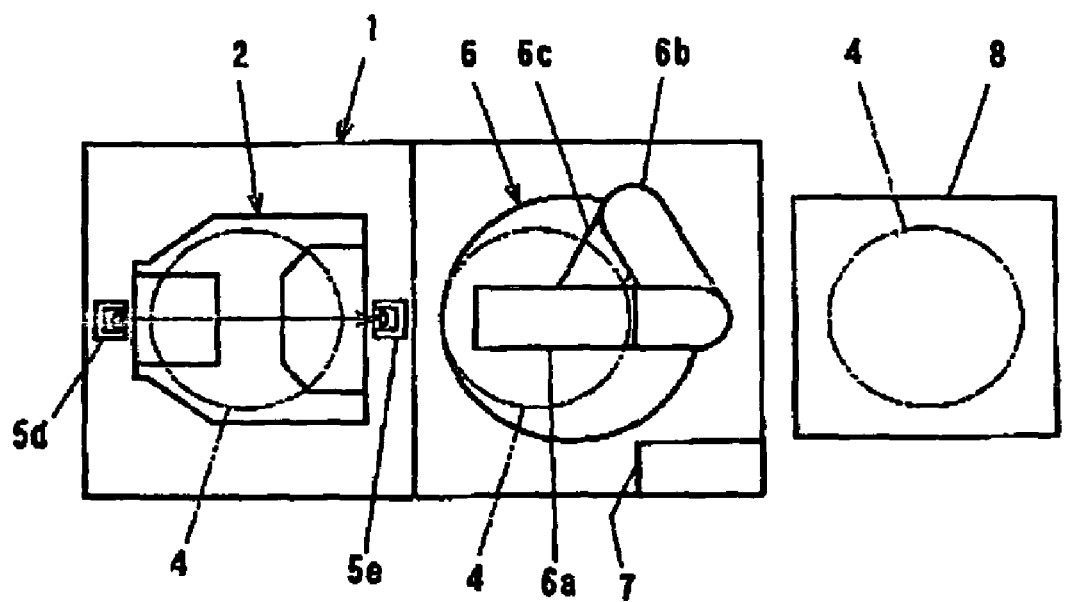
FIG. 22 is a schematic plan view showing a prior art wafer treatment device not provided with a load port.
Figure 24:
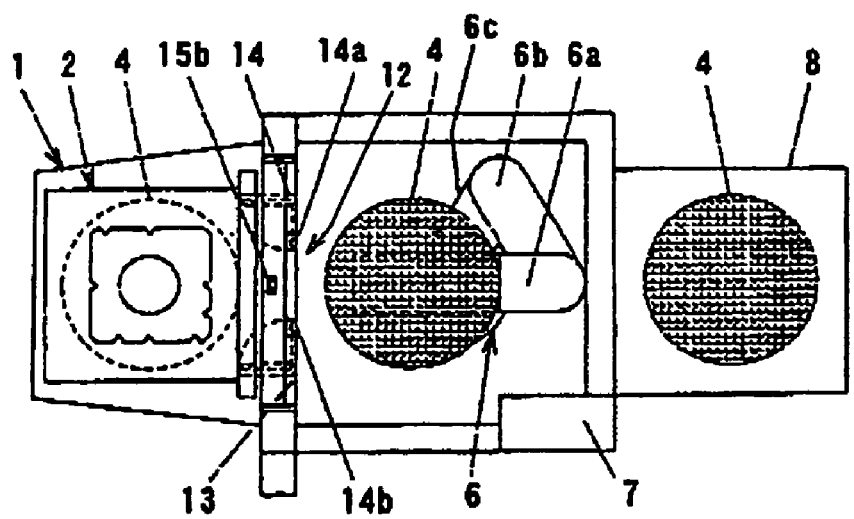
FIG. 24 is a schematic cross sectional view showing a prior art wafer treatment device provided with a load port along the line A—A of FIG. 23.

The load port 12 of the above embodiment, similarly to the that shown in FIGS. 23 and 24 except for the structure of the wafer mapping device, as well as having a frame 31 for supporting the fan filter unit 30 and having a stage 1 outside the frame 31, is provided on the stage 1 with a stand 3 on which the closed type clean container (FOUP) 2 as shown in FIG. 20 is mounted, and within the stage 1 a normal linear motion mechanism 9 is provided as a container main body reciprocatingly moving means or advancing/acting the stage 3 together with the container main body 2a of the clean container 2 mounted thereon with respect to the window frame 31a of the frame 31.

A port door 13, L-shaped in vertical section, is located inside the window frame 31a of the frame 31, and in order to force contact and elevate the front door 2a of the clean container 2 and the port door 13, a port door elevating mechanism 16 for elevating the port door 13 is provided as port door elevating means in the stage 1. The port door elevating mechanism 16, similarly to that shown in FIGS. 23 and 24, has a motor 16a, a ball screw 16b rotatably supported at both end portions in an attitude where its axis extends vertically and rotated by the motor 16a via a pulley belt transmission medial, a ball nut 16c screwed to the screw 16b and elevated up and down by the rotation of the screw 16b, a bracket 17 with a horizontal C-shaped cross section as shown in FIG. 4 fixed to the ball nut 16c, and a coupling member 18 for positioning the port door 13 above the bracket 17 and integrally fixing the pore door 13 to the bracket 17 as shown in FIG. 4.

The load port 12 of the above embodiment also has, in the port door 13, as a front door detachably fixing means, a registration pin 13a for positioning the front door 2a of the clean container 2, a latch key 13b for lock releasing by retraction of a latch 2e (refer to FIG. 20) of the front door 2a and reloading with the container main body 2b by protrusion of the latch 2e, and an absorption pad 13c for absorption fixing of the font door 2a, the latch key 13b being driven and rotated by a rotating mechanism, not shown, with an air cylinder or the like built into the port door 13 as a drive source and the adsorption pad 13c performing attachment and release of the front door 2a by connection to a negative pressure source, not shown and release thereof.

In the load port 12, the wafer mapping device of the above embodiment, as shown in FIG. 4, as well as having a C-shaped swinging frame 22 as a swinging member, fixed with a spindle 23 under the part door 13 extending parallel to the port door 13 with a horizontal axis C as a central axis, and the swinging frame 22 being positioned near the port door 13 surrounding both side surfaces and the top end surface thereof, ha a C-shaped sensor plate 21 fixed to the upper end portion of the swinging frame 22, and a pair of sensor portions 20 are provided by means of two arm portions separated from each other, protruding from the swinging frame 22 toward the stage 3 and consequently the clean container 2 mounted thereon, while at the tip portions of these sensor portions 20 a normal light emitting device 20a and light receiving device 20b for recognizing wafers 4 are fixed facing each other. Also, the above spindle 23 is rotatably supported on the port door fixing bracket 17 via bearings 24, the swinging frame 22 being thereby swingably connected to the port door 13 around the horizontal axis C.

The wafer mapping device of the above embodiment has, also fixed to the bracket 17 so as to be positioned below the spindle 23, an air cylinder 25 as a swinging drive means, and a rod end 25a of the air cylinder 25 abuts the lower portion of a lever 26 fixed to the spindle 23. Further, an L-shaped stopper member 27 that engages with the lower end of the lever 26 is provided protruding from the bracket 17 in order to restrict the tilt angle of the swinging frame 22 and consequently the amount by which the sensor portions 20 enter the inside of the clean container 2, and a damper 28 that utilizes a spring or fluid pressure is provided in the stopper member 27 to reduce to a minimum vibrations due to bumping of the lower end portion of the lever 26. Also, a continuously energizing return spring not shown in the drawings is provided facing the vertical starting point of the swinging same 22.

Figure 6:
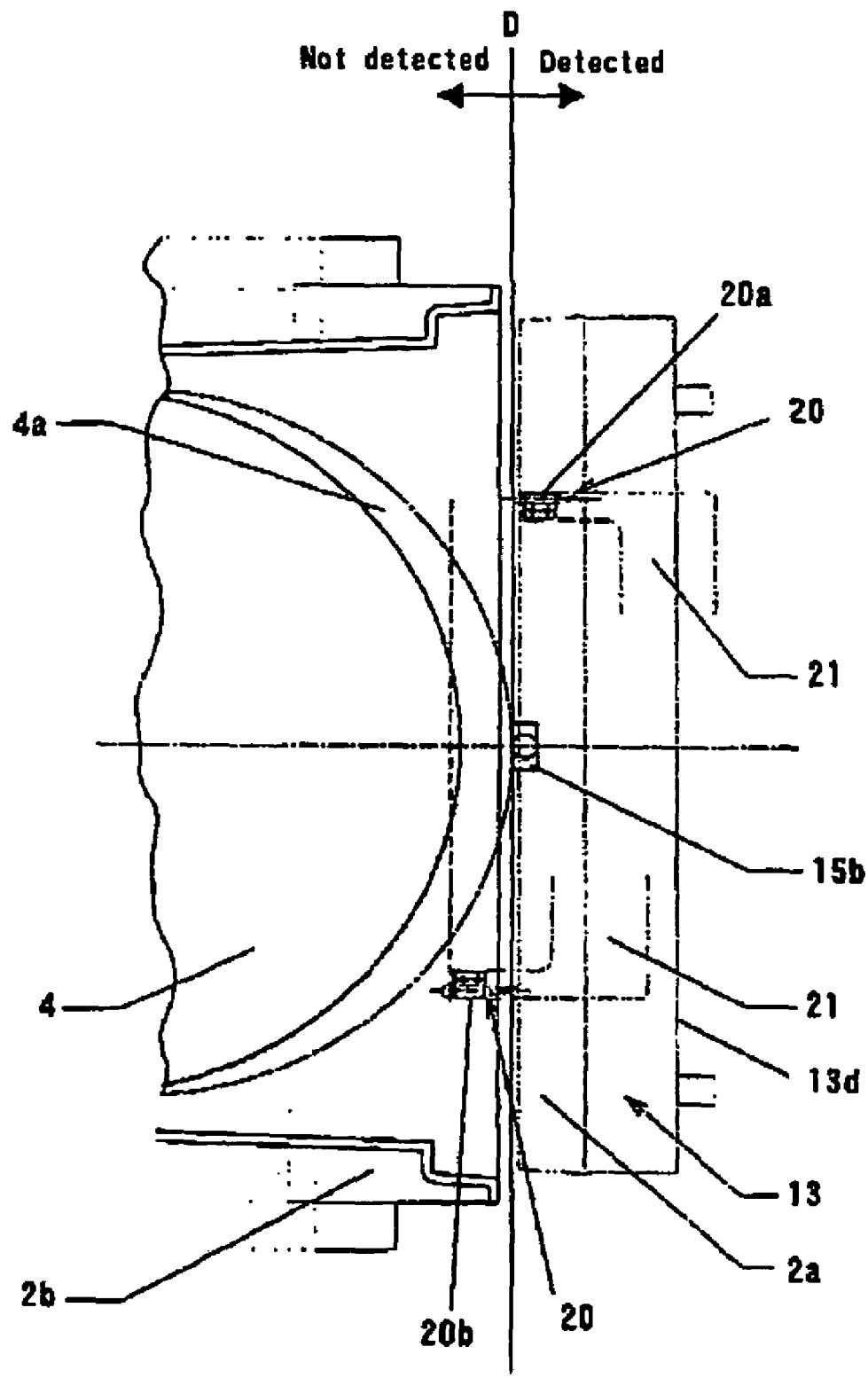
FIG. 6 is an explanatory drawing showing an operating state of the wafer mapping device of the above embodiment as a plan view.
Figure 17:
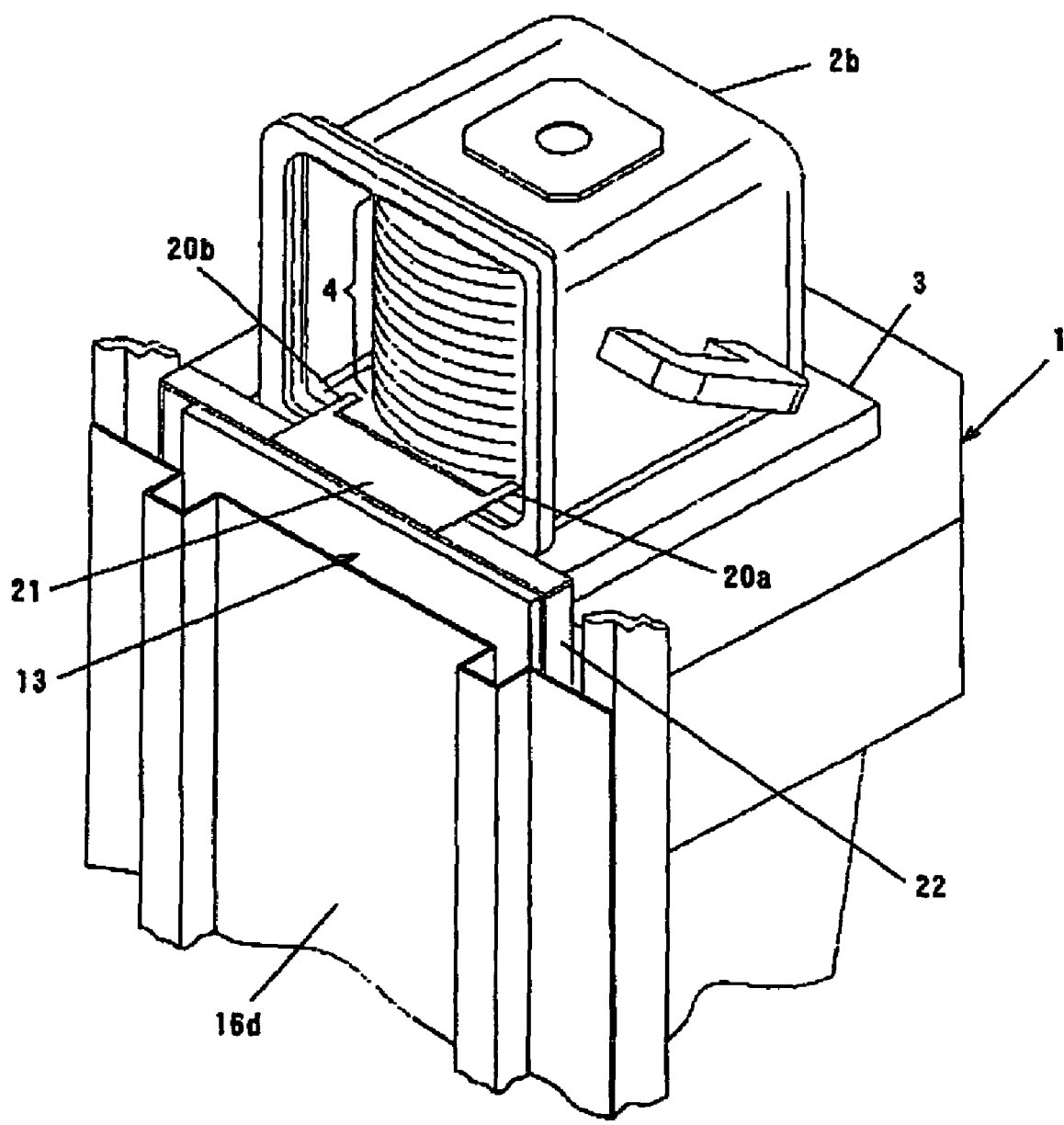
FIG. 17 is an explanatory drawing showing a perspective view of the operating state of a wafer mapping device of an embodiment of the present invention and a load port of an embodiment of the present invention provided therewith.

Further, in the load port of the above embodiment, a partition plate 16d having two vertical channel portions fox housing the coupling member 18 in the example shown in the drawing so that it is vertically movable is provided on the side surface of the window frame 31a of the frame 31 facing to the wafer conveying robot 6, as shown in FIGS. 2 and 3, and FIG. 17 described later. Because the linear motion mechanism 9 for reciprocally moving the clean container 2, the port door elevating mechanism 16, and the spindle 23 of the swinging frame 22, which are movable portions that tend to generate contaminants, are all installed outside the mini-environment, which is the positive pressure high cleanliness area at the boundary of the partition plate 16d and the port door 13, even if contaminants are generated by these movable portions those contaminants are not carried into the mini-environment. Also, because the above-described rotating mechanism for rotating the latch key 13b and rocking/releasing the latch 2e, which is also a movable portion, as shown in FIG. 6 described hereafter, is housed inside the thickness of the port door 13 provided with a rear cover 13d on the side facing the mini-environment, even if contaminants are generated those contaminants are not carried into the Ode of the mini-environment.

Here, explaining another characteristic of the load port of the above embodiment, in this load port, by daring to provide gaps between the port door 13 and the swinging frame 22, between the port door 13 and the window frame 31a of the frame 31, and between the clean container 2 and the window frame 31a of the frame 31, the high cleanliness air flow from the mini-environment as positive pressure high cleanliness area is expelled to the outside, accumulation of contaminants generated by the above movable portions, even if only a little, and intrusion of contaminants from the outside to the interior of the mini-environment is prevented, and the extremely high cleanliness inside the mini-environment can thereby be ensured.

Figure 5:
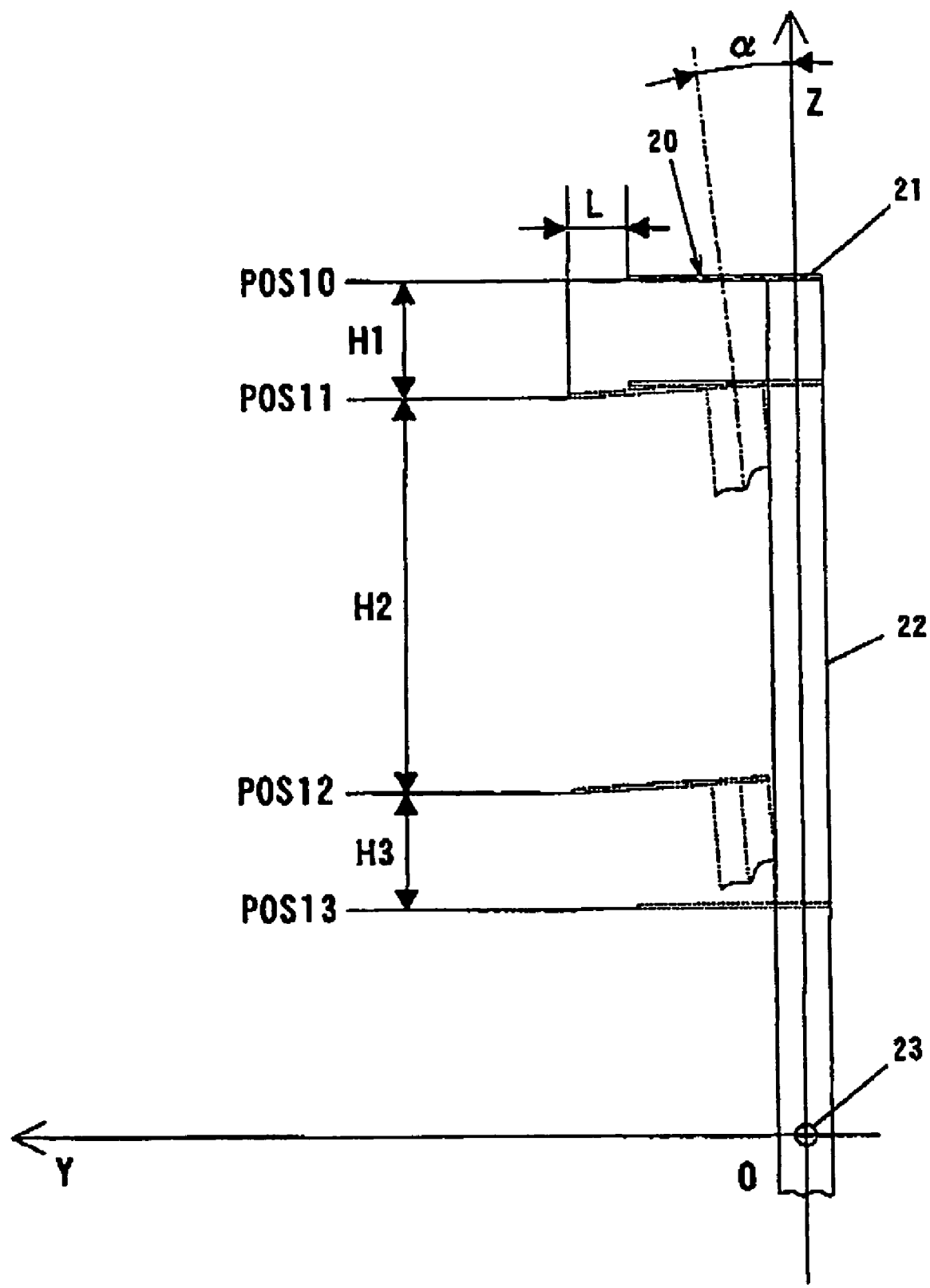
FIG. 5 is an explanatory drawing showing an operating state of the wafer mapping device of the above embodiment as a side view.

In the wafer mapping device of the above embodiment, during the wafer mapping operation described later, the swinging frame 22, as shown in FIG. 5, swings around the horizontal axis C with the spindle 23 as a fulcrum between a mapping position tilted at $\alpha°$ toward the wafers 4 inside the clean container (FOUP) 2 on the left hand side of the drawing and a vertical staring position on the right hand side of the drawing by means of the cooperation of the reciprocal movements of the rod end 25a of the air cylinder 25 that acts as a swinging drive means and the energizing force of the return spring.

Further, in the wafer mapping device of the above embodiment, as shown in FIGS. 1 to 3, a light emitting device 15a and light receiving device 15b are provided as protrusion detecting means to detect the existence of the wafers 4 and other objects projecting from the container main body 2a of the clean container 2 to the outside, and in this embodiment, the light emitting device 15a is fixed facing downward in the central portion of the upper portion (head frame portion) of window frame 31a of the frame 31, and the light receiving device 15b is fixed facing upward in the central portion of the lower portion of port door 13, opposite the light emitting device 15a. The light emitting device 15a can also be fixed to the upper portion of the port door 13, or the light receiving deice 15b can also be fixed to another member adjacent to the lower portion of the port door 13. Further, as well as fixing the light emitting device 15a to the lower portion of the port door 13 or another member adjacent thereto, the light receiving device 15b can be fixed to the central portion of the upper portion (head frame portion) of the window frame 31a of the frame 31 or the upper portion of the port door 13.

In the device concerned, as shown in FIG. 6, when wafers 4a or other objects projecting from the container main body 2a block the light path from the light emitting device 15a to the light receiving device 15b, the light receiving device 15b detects the object projecting from the container main body 2a as an obstacle and outputs a light shielding signal, the light shielding signs is transmitted from the light receiving device 15b to the superior control device 7, and the control device 7 performs a process such as an emergency stop or the like to prevent damage to the protruding wafer 4a, load port 12, container main body 2a of the clean container 2, and the like.

Figure 7:
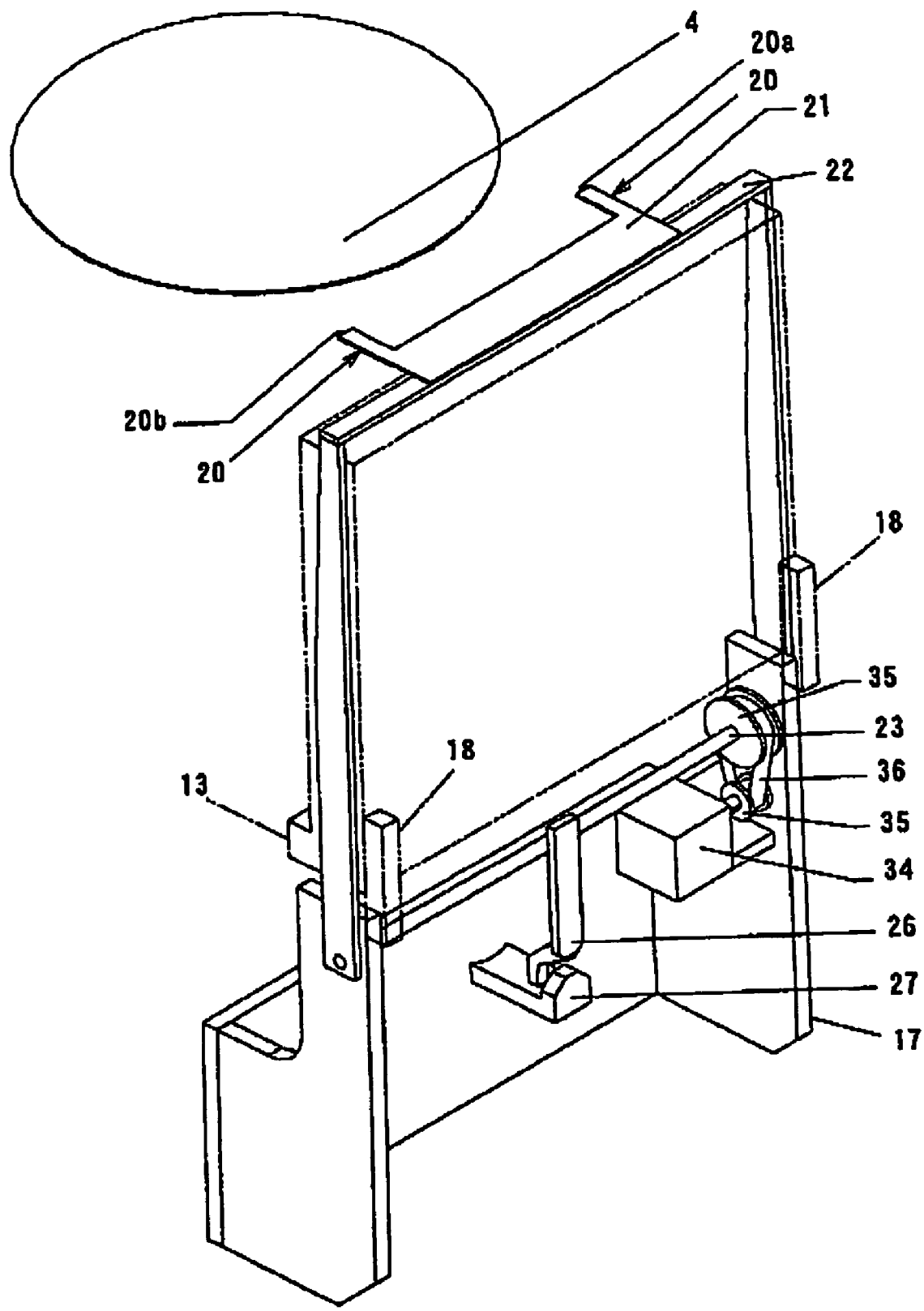
FIG. 7 is a perspective view showing a wafer mapping device of another embodiment provided with a different swing drive means to that of the embodiment of FIG. 4, from the some viewpoint as FIG. 4.
Figure 8:
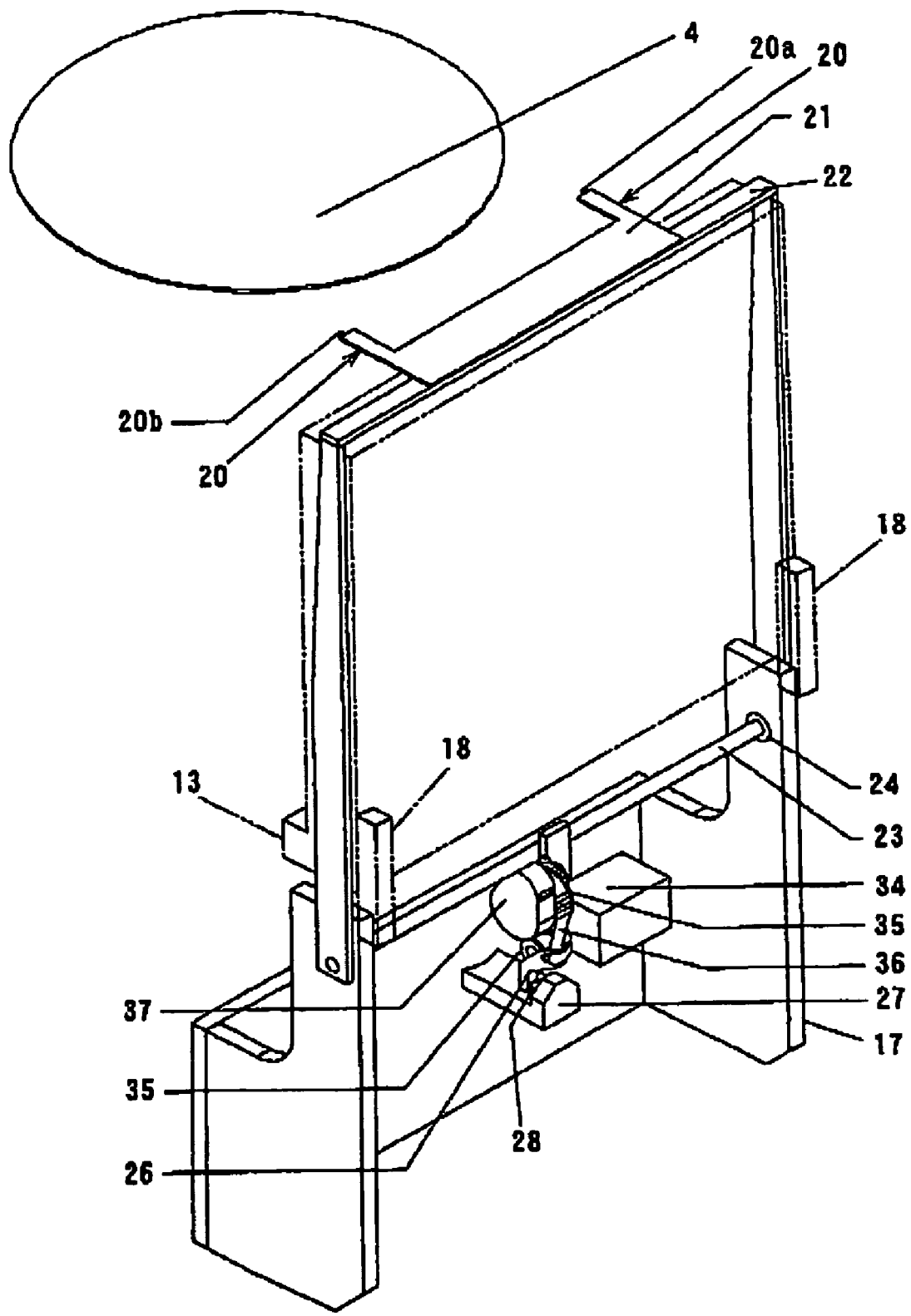
FIG. 8 is a perspective view showing a wafer mapping device of yet another embodiment provided with a different swinging device means to that of the embodiment of FIG. 4, from the same viewpoint as FIG. 4.

FIG. 7 and FIG. 8 are perspective drawings each showing another embodiment with differing swinging drive means for the wafer mapping device of the present invention. In the example shown in FIG. 7 the driving power of the motor 34 is ted to the spindle 23 via a pulley-belt transmission reduction mechanism consists of pulleys 35 and a belt 36, and in the example shown in FIG. 8 the driving power of the motor 34 is transmitted to the spindle 23 via a pulley-belt transmission reduction mechanism consists of pulleys 35 and a belt 36 and a cam mechanism formed by a cam 37 and the lever 26.

Figure 9:
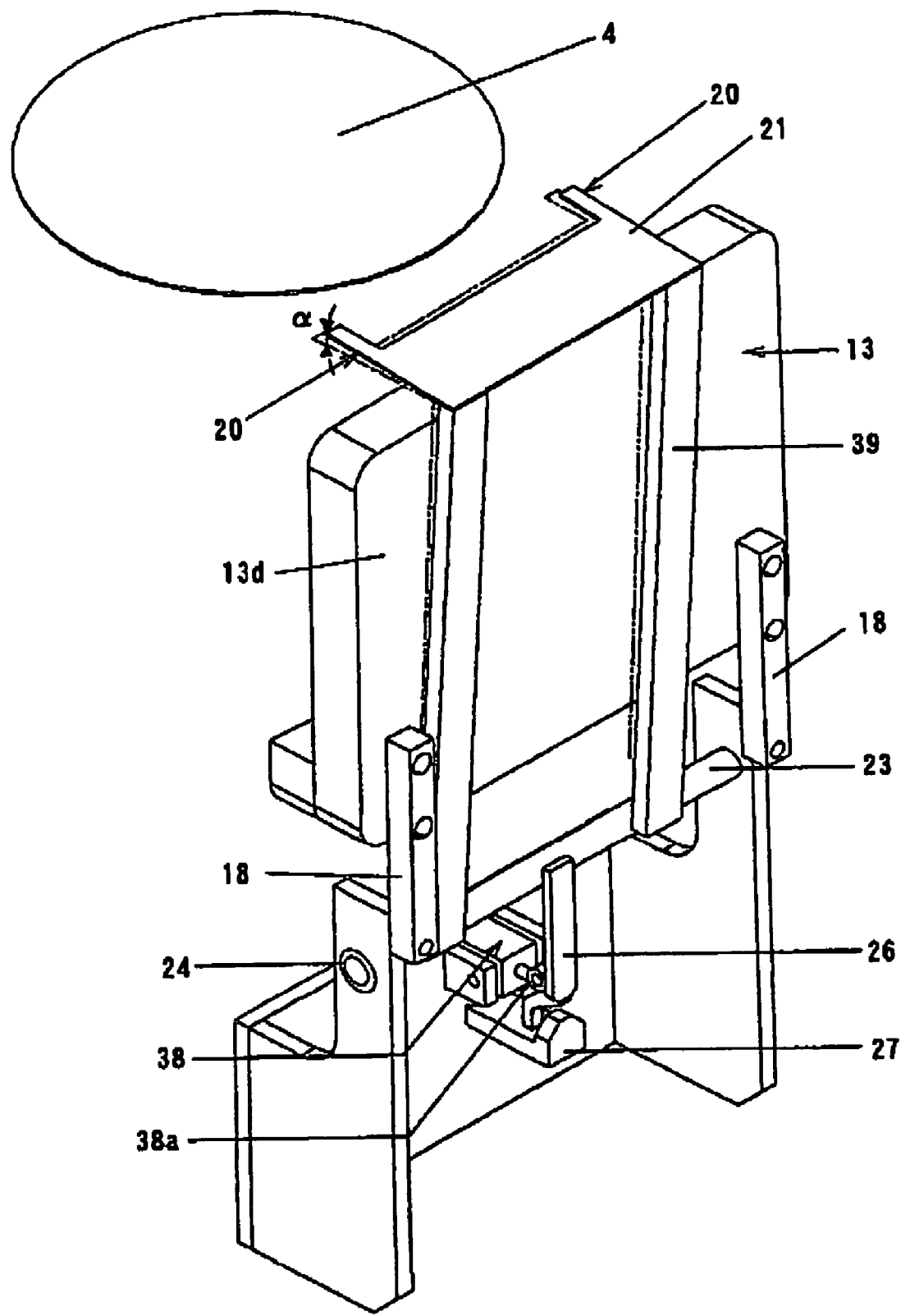
FIG. 9 is a perspective view showing a wafer mapping device of still another embodiment provided with a different 6wing drive means and swinging member to those of the embodiment of FIG. 4, from the same viewpoint as FIG. 4.
Figure 10:
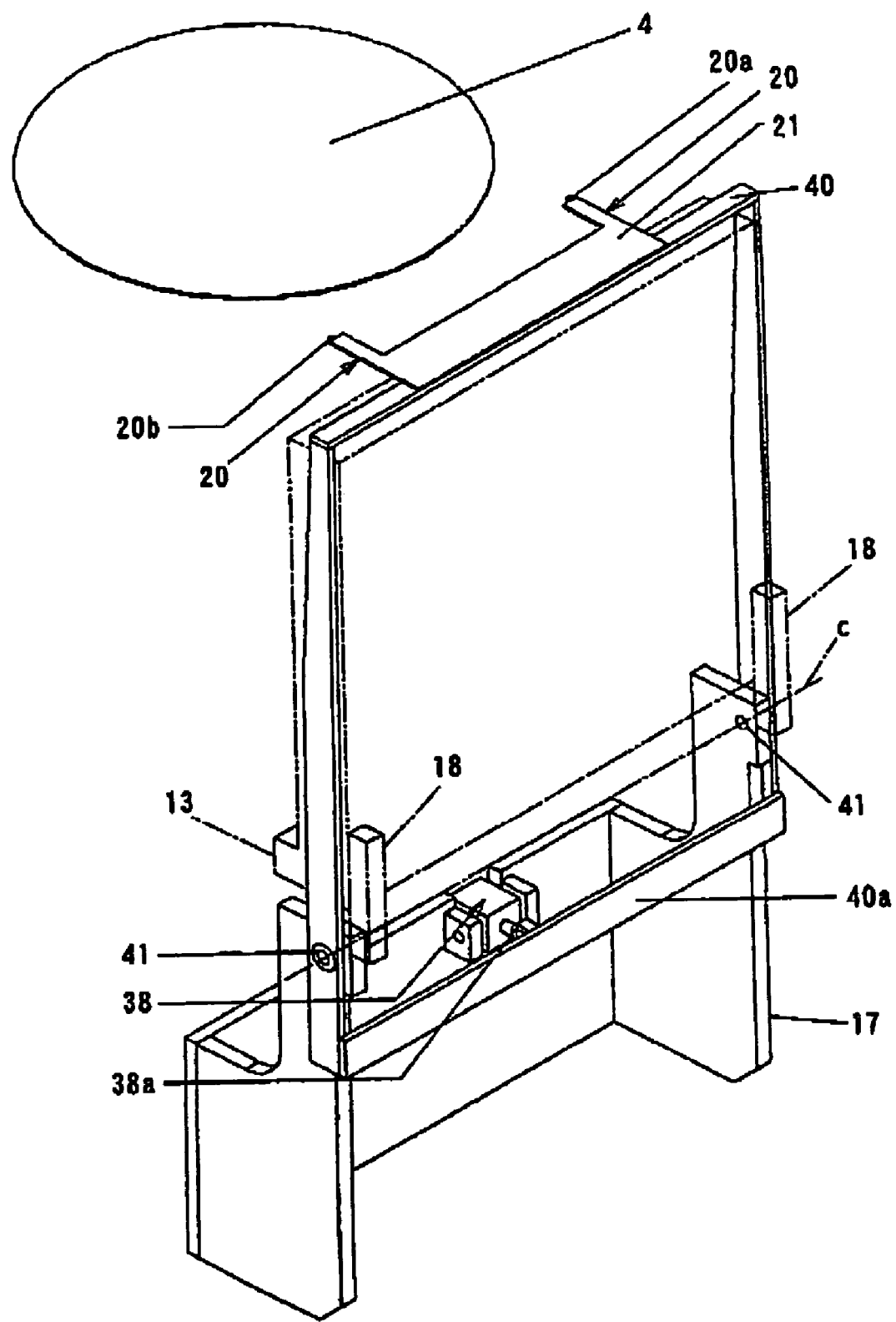
FIG. 10 is a perspective view showing a wafer mapping device of a further embodiment provided with a different swinging drive means and swing member to those of the embodiment of FIG. 4, from the same viewpoint as FIG. 4.

FIG. 9 and FIG. 10 are perspective drawings each showing yet another embodiment with differing swinging members as well as differing swinging drive means for the wafer mapping device of the present invention, either one of the example shown in FIG. 9 and the example shown in FIG. 10 having a solenoid 38 for reciprocally moving a plunger 38a by means of an excitation force as the swinging drive means, while in the example shown in FIG. 9 two swung rods 39 are located at the rear surf side of the port door 13 and fixed to the spindle 23 at both side portions of the lever 26 as swinging members, and the solenoid 38 swings the two swinging rods 39 by swinging the lever 26 wit the cooperation of a plunger 38a and the return spring in the example shown in FIG. 10 a rectangular swinging frame 40 is supported via bearings by two spindles 41 protruding outward so as to be positioned on the horizontal axis C on the bracket 17 as a swinging member, and the solenoid 38 swings the entire swinging frame 40 wound the horizontal axis C by swinging the lower portion 40a of the swinging frame 40 with the cooperation of the plunger 38a and the return spring.

Incidentally, the swinging drive means in the wafer mapping device of the present invention is not limited to these, and in addition thereto, a means utilizing a combination conceivable by those skilled in the art, such as cylinders, solenoids, motors, pulleys, belts, cams, springs, piezo elements, dampers utilizing fluid pressure, and the like are acceptable. Also, the swinging member in the wafer mapping device of the present invention is not limited thereto and, as shown in FIG. 11 for example, can be provided with a spindle 23 at its lower end and made in an L-shape as seen from the side, its central portion being energized by an air cylinder 25 or the like as a swing drive means.

Figure 11:
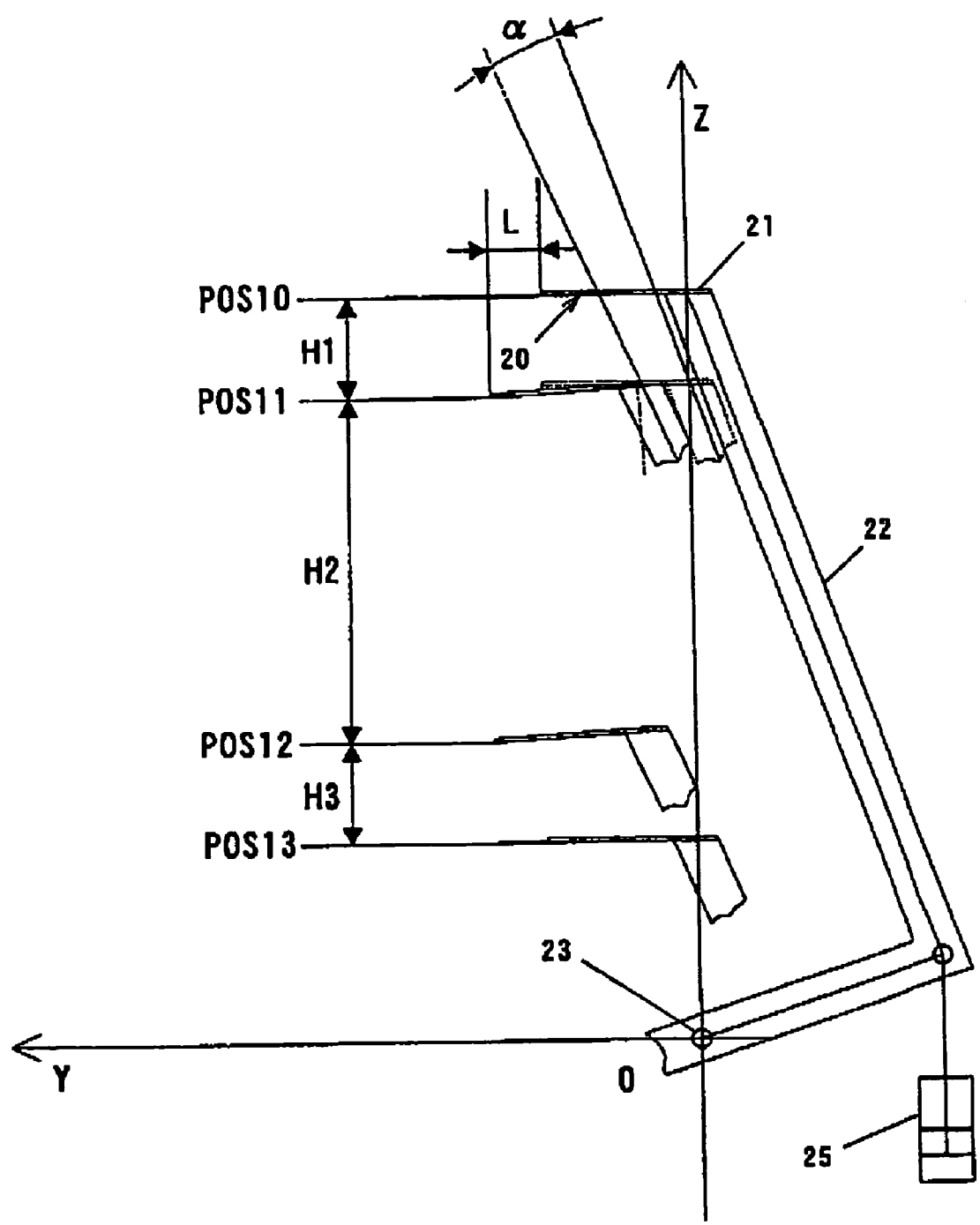
FIG. 11 is an explanatory drawing showing an operating state of the wafer mapping device of another embodiment of the present invention as a side view.

In the example of FIG. 11, during the wafer mapping operation described later, the swinging frame 22 that serves as the swinging member swings around the horizontal axis C with the spindle 23 as a fulcrum between a mapping position rotated at $\alpha°$ toward the wafers 4 inside the clean container (FOUP) 2 on the left band side of the drawing and a starting position on the right hand side of the drawing by means of the cooperation of the reciprocal movements of the rod end 25a of the air cylinder 25 that act as a swinging drive means and the energizing force of the return spring.

Next, the track of the sensor portion 20 during the wafer mapping operation of the wafer mapping device of each of the above embodiments will be explained with reference to FIGS. 5, 6, and 11. During the wafer mapping operation, as shown in FIGS. 5 and 11, by tilting the swinging frame 22 or 40, or the swinging rods 39 $\alpha°$ toward the clean container (FOUP) 2 side with the spindle 23 as a fulcrum the tip portions of the sensor 20 are inserted into the inside of the container main body 2b of the clean container 2 and the light emitting device 20a and light receiving device 20b, not shown here in the drawings, fixed to the tip portions of the sensor 20 are moved to a position where wafers 4 inside the container main body 2b can be detected. The light emitting device 20a and light receiving device 20b of the tip portions of the sensor 20 are thereby moved from a staying position POS10 to a detection commencement position POS11 toward the container main body 2b in a Y axis direction by a disuse L descending by a height of H1 in the Z axis direction. The upper half of FIG. 6 shows the light emitting device 20a of the sensor 20 in the starting position POS10, while the lower half of FIG. 6 shows the light receiving device 20b of the sensor portion 20 in the detection commencement position POS11.

FIG. 6 also shows a case where the wafer 4a protruding from the container main body 2a blocks the light path from the light emitted device 15a to the light receiving device 15b, and when the wafer 4a protrudes toward the port door 13 side (right had side in the drawing past the boundary line D, because the light receiving device 15b outputs a signal indicating the existence of the wafer 4a due to the reduction in the received light amount, as described previously interference between the port door 13 and the front door 2a or the like tightly contacted thereto, and the wafer 4a accompanying elevation of the port door 13 can be prevented beforehand.

Figure 12A:
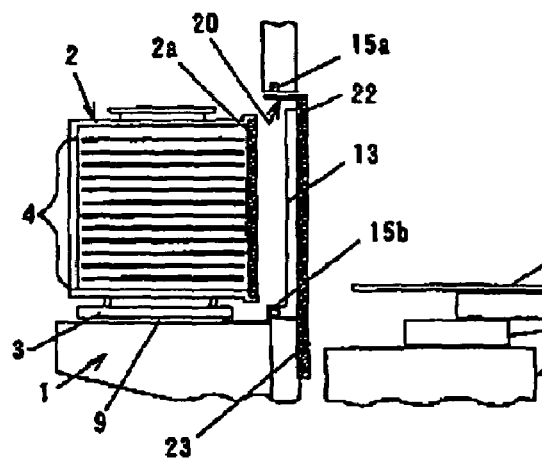
FIG. 12 is an explanatory drawing showing a vertical cross sectional view of the operating state of a wafer mapping device of an embodiment of the present invention and a load port of an embodiment of the present invention provided therewith, together with the operating state of a wafer conveying robot.
Figure 15A:
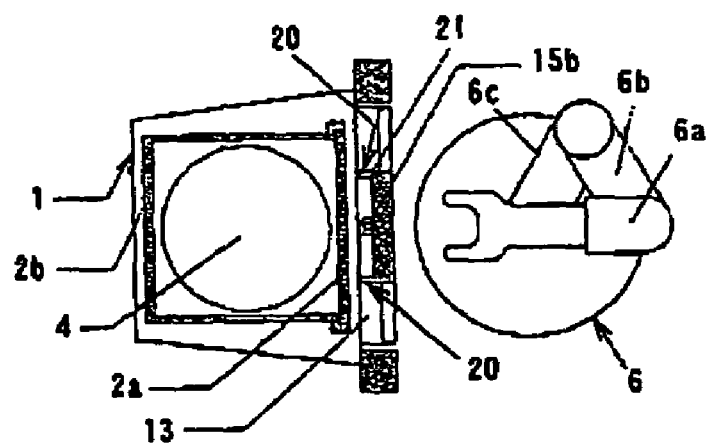
FIG. 15 is an explanatory drawing showing a horizontal cross sectional view of the operating state of a wafer mapping device of an embodiment of the present invention and a load port of an embodiment of the present invention provided therewith, together with the operating state of a wafer conveying robot.

Next, the wafer mapping operation of the wafer mapping device of the above embodiments based on the operation of the control device for the load port 12 will be explained with reference to the vertical ross sectional views of FIG. 12A to FIG. 12D, and FIG. 13A and FIG. 13B, the horizontal cross sectional views of FIG. 15A to FIG. 15C, and FIG. 16A to FIG. 16C, and the flowchart of FIG. 18, using the first embodiment as a representative (the other embodiments operate in the same manner). Firstly, the clean container (FOUP) 2 is mounted on the stage 3 of the load port 12 (FIG. 12A and FIG. 15A). Al this time the port door 13 is in the uppermost position POS0, the swinging frame 22 is in a vertical attitude, and the light emitting device 20a and light receiving device 20b are in the start position POS10 shown in FIG. 5.

Figure 12B:
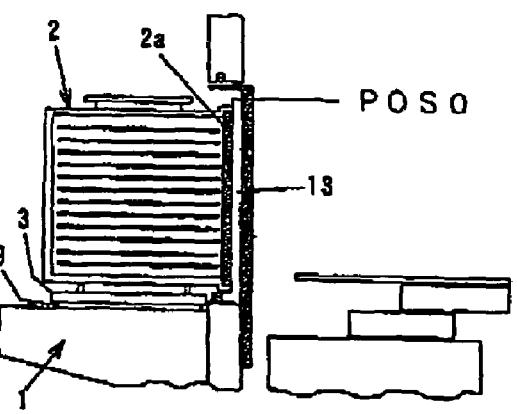
Figure 12C:
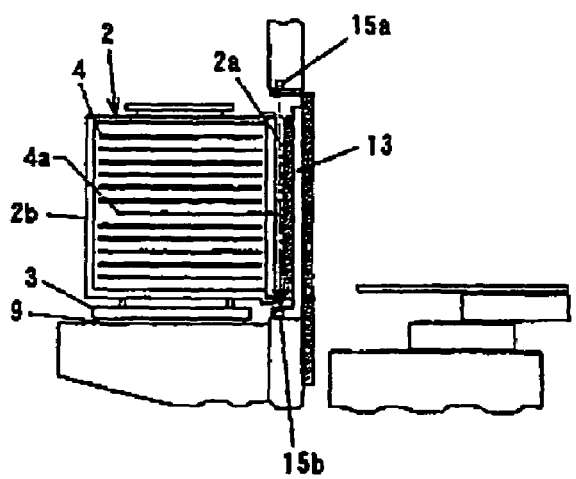
Figure 15B:
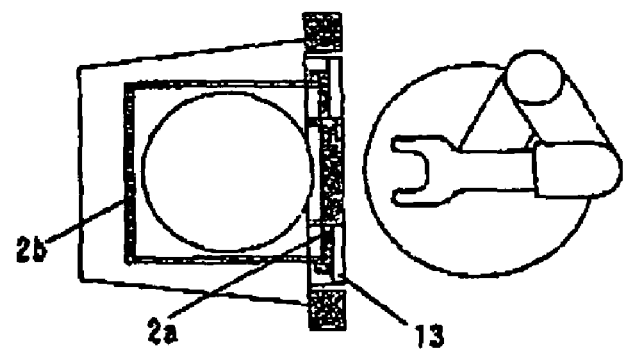
Figure 15C:
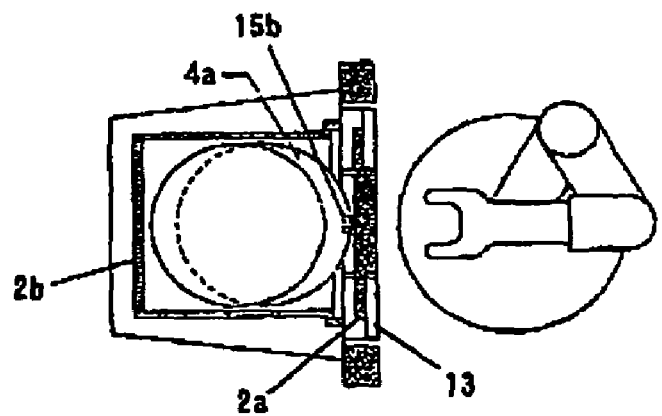
Figure 18:
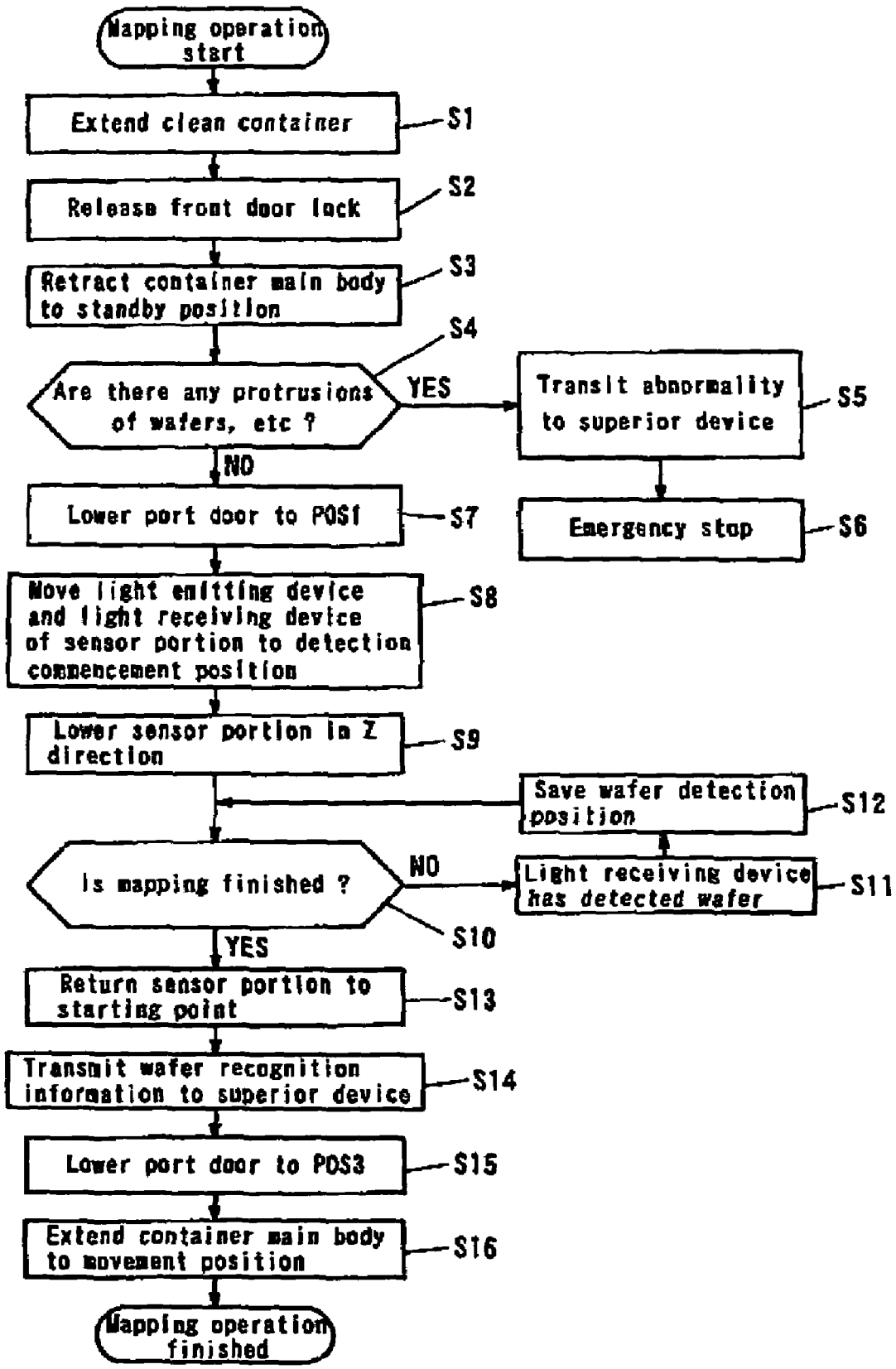
FIG. 18 is flow chart showing the mapping operation of a wafer mapping device of an embodiment of the present invention and a load port of an embodiment of the present mention provided therewith.

Thereafter, in step S1 of FIG. 18 the control device, by operating the linear motion mechanism 9, moves forward the stage 3 together with the clean container 2 thereon in the direction of the port door 13. At this time, the registration pin 13a and latch key 13b of the front surface of the port door 13 are respectively inserted in the registration pin hole 2c and latch key hole 2d of the front door 2a of the lean container 2, and the port door 13 is fixed in a state where the front door 2a is tightly contacted to the port door 13 by means of the absorption pad 13c of the port door 13 (FIG. 12B and FIG. 15B). Next, in step S2, the lock of the front door 2a by the latch 2c is released by rotating the latch key 13b in the latch key hole 2d.

Subsequently, the above control device, in step S3, retracts the stage 3 to a standby position together with the container main body 2b of the clean container 2 thereon by operating the above linear motion mechanism 9 (FIG. 12C and FIG. 15C), and in the following step S4, whether there is a wafer 4a or any other obstacle that protrudes from the inside of the container main body 2b at the standby position is determined from a signal from the light receiving device 15b, in the bottom central portion of the port door 13, that receives light from the light emitting device 15a fixed to the top central portion of the window frame 31a of the frame 31. And if a wafer 4a protrudes or there is another obstacle, the control device in step S5 transmits the abnormal situation to a superior control device 7 so as to prevent damaging of a wafer and maintain the device, and the superior control device 7 that receives the abnormal situation information performs a procedure such as emergency stopping the load port 12, wafer conveying robot 6, and processing device 8 in step S6.

Figure 12D:
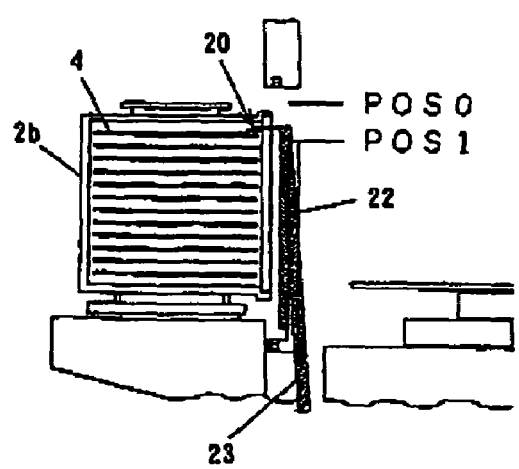
Figure 16A:
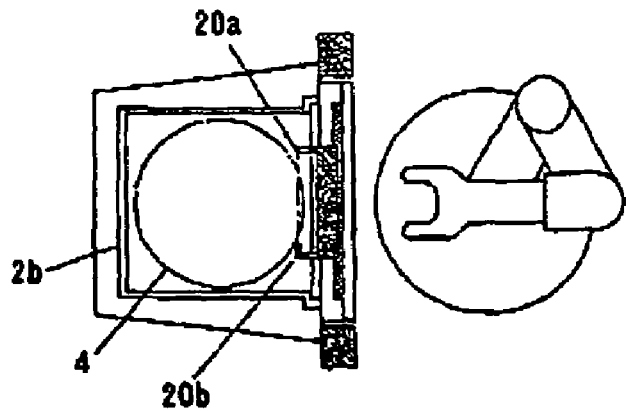
FIG. 16 is an explanatory drawing showing a horizontal cross sectional view of the operating state of a wafer mapping device of an embodiment of the present invention and a load port of an embodiment of the present invention provided therewith, together with the operating state of a wafer conveying robot.

On the other hand, if in the above step S4 the light receiving device 15b has not detected a wafer 4a or other obstacle within the range of movement of the port door, by the control of the above control device the port door 13 is lowered to the position POS1 in step S7, then in step S8 by the control of the control device, the swinging frame 22 is inclined α° toward the container main body 2b in the standby position, and the light emitting device 20a and lift receiving device 20b at the tips of the sensor portion 20 are inserted in the container main body 2b and moved to the detection commencement position POS11 (FIG. 12D and FIG. 16A).

Subsequently the above control device, in step S9, lowers the port door 13 from the position POS1 to the position POS2, lowers the light emitting device 20a and light receiving device 20b at the tips of the sensor portion 20 from the detection commencement position POS11 to the detection completion position POS12 by the height H2 via the swinging frame 22 as shown in FIG. 5, determines during that interval, in step S10, whether they have descended to the detection completion position POS12 and mapping has been completed, and if not, in step 11 detects the wafers 4 by means of the light receiving device 20b and in step 12 stores the wafer detection position in the relevant control device and repeats the process. In other words, based on changes in the output signal of the light receiving device 20b generated by intermittent blocking of the light path between the light emitting device 20a and the light receiving device 20b by wafers 4 accompanying the lowering of the sensor portion 20, as well as recognizing that the wafers 4 are housed in the container main body 2b, it stores position information (position on the Z axis) of the port door 13 when the light path is blocked.

Figure 13A:
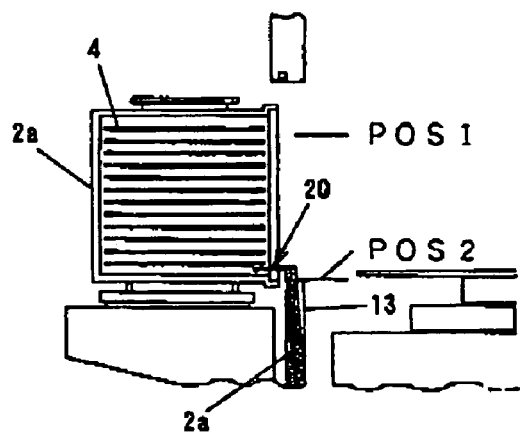
FIG. 13 is an explanatory drawing showing a vertical cross sectional view of the operating state of a wafer mapping device of an embodiment of the present invention and a load port of an embodiment of the present invention provided therewith, together with the operating state of a wafer conveying robot.
Figure 16B:
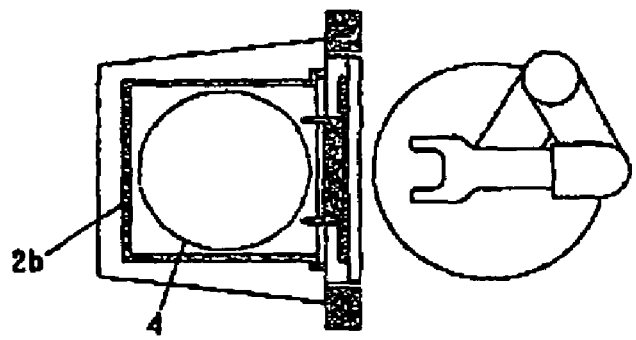

On the other hand, in step S10, as shown in FIG. 13A and FIG. 16B as well as FIG. 17, if it is determined that the light emitting device 20a and light receiving device 20b at the tips of the sensor portion 20 have descended to the detection completion position POS12 and mapping has concluded, the above control device returns the swinging frame 22, inclined at α°, to a vertical attitude and returns the light emitting device 20a and light device 20b at the tips of the sensor portion 20 to the starting position apart from the container main body 2b in the Y axis direction in step S13.

Then the control device, in step S14, transmit to the superior control device 7 the position information of the port door 13 when the light path between the light emitting device 20a and light receiving device 20b is blocked by the wafers 4. The superior control device 7 can thereby obtain information concerning which shelves among the plurality of shelves inside the container main body 2b the wafers 4 are mounted and stored on, information on whether there are wafers 4 housed in the container main body 2b on different levels, etc., and because the superior control device 7 sends this information to the control device for the wafer conveying robot 6 and convey the wafers 4 inside the container main body 2b, slipping wasted conveying operations with respect to shelves in the container main body 2b on which wafers 4 are not housed and conveying the wafers 4 by selecting specific shelves is possible.

Figure 13B:
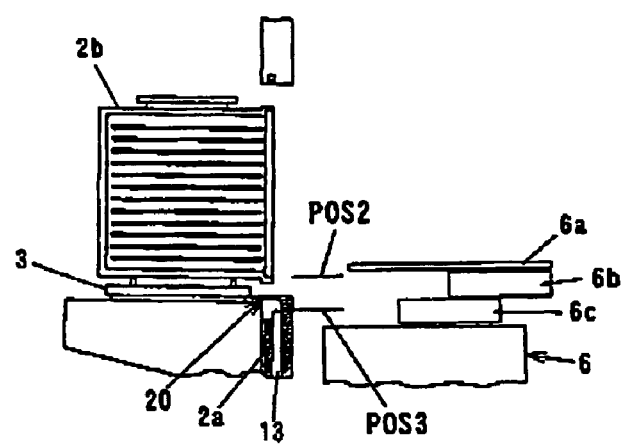
Figure 16C:
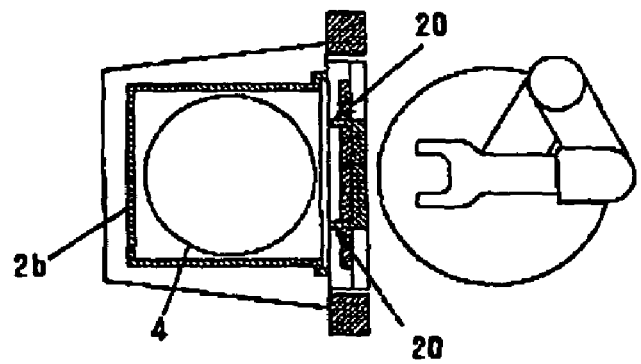

Subsequently, the above control device, in step S15, lowers the port door 13 to position POS3 as shown in FIG. 13B and FIG. 16C, and as well as lowering the light emitting device 20a and light receiving device 20b at the tip of the sensor portion 20 from the detection completion position POS12 to the standby position POS13 by a height of H3 as shown in FIG. 5, stores the port door 13 in the lower portion of the load port 12, then in step S16, by operating the linear motion mechanism 9, moves forward the stage 3 and, as shown in FIG. 13B, moves the container main body 2b on the stage 3 to a wafer receiving/delivering position for the wafer conveying robot 6. With this, the mapping operation sequence is complete.

Figure 16D:
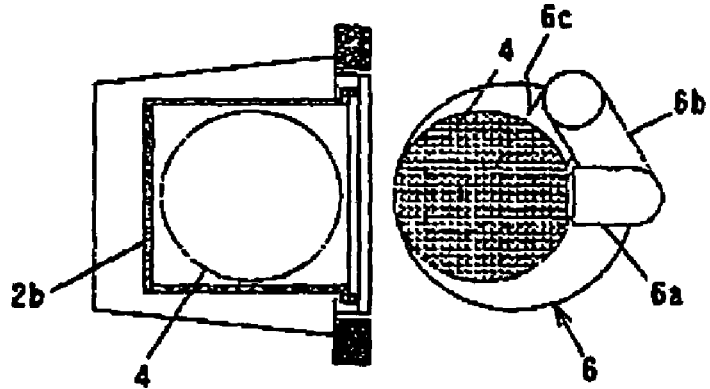
Figure 19:
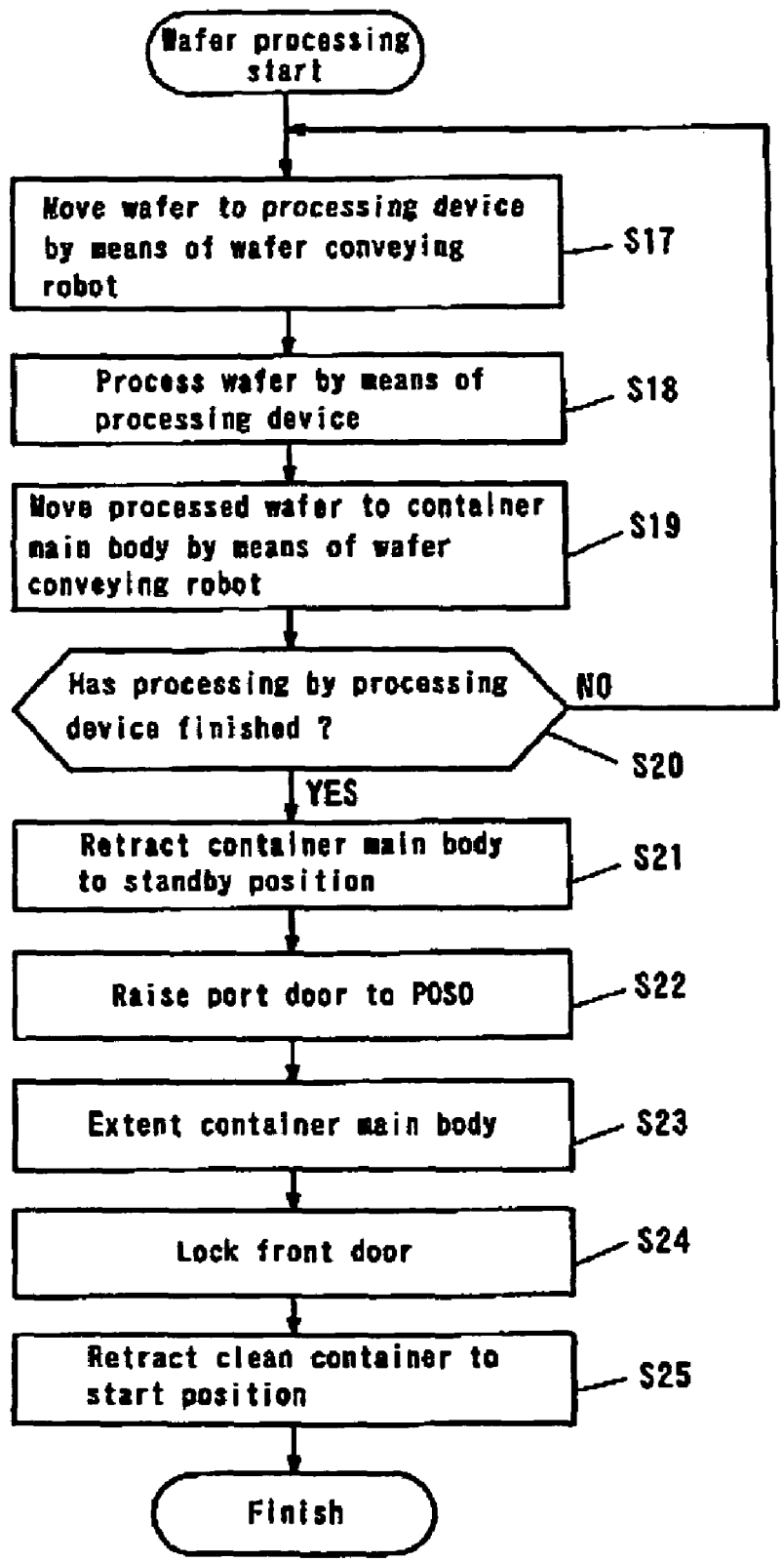
FIG. 19 is flow chart showing the wafer processing operation of a wafer treatment device provided with a load port of an embodiment of the present invention and a wafer conveying robot.

Next, following the above mapping operation, with resect to the operation of the wafer treatment device, from carrying out of the wafers 4 by the wafer conveying robot 6 from inside of the container main body 2b to the return of the wafers 4 to the inside of the container main body 2b via processing of the wafers 4 by the wafer processing device 8, based on the coordinated operations of the two subordinate control devices for the load port 12 and the wafer conveying robot 6 under the control of the superior control device 7 an explanation thereof will be given with referee to the vertical cross sectional views of FIG. 13C, FIG. 13D, FIG. 14A and FIG. 14B, the horizontal cross sectional view of FIG. 16D, and the flowchart of FIG. 19, using the first embodiment relating to the wafer mapping device as a representative (the other embodiments operate in the same manner).

Figure 13C:
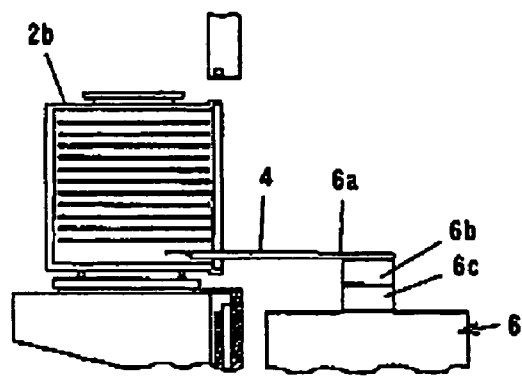
Figure 13D:
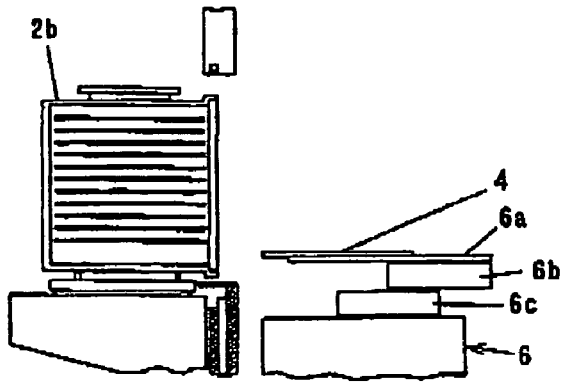

Firstly, in step S17 of FIG. 19 the wafer conveying robot 6 control device operates the wafer conveying robot 6 to extract the wafer 4 housed in the container main body 2b in the wafer receiving/delivering position as shown in FIG. 13C, FIG. 13D and FIG. 16D and move the wafer 4 to the interior of the wafer processing deice 8, then in step S18 the superior control device 7 operates the wafer processing device 8 to perform such processing as etching and the like, for example, on the wafers 4 moved to the interior of the wafer processing device 8. Incidentally, the wafer conveying robot 6 here has a rotating arm 6b supporting a hand 6a and another rotating arm 6c for supporting the rotating arm 6b, and is able to move the hand 6a to any position by the rotation of the rotating as 6b and 6c, while the wafer conveying robot of the wafer processing device provided with the load port of the present invention is not limited to this and can be polar coordinate type that moves the hand by arm rotation and extension, or a rectangular coordinate type that moves the hand by a combination of linear motion mechanisms.

Next, in step S19 the wafer conveying robot 6 control device operates the wafer conveying robot 6 to store wafers 4 processed by the wafer processing device 8 on shelves specified by the operator of the wafer processing device inside the container main body 2b, then in step S20 the superior control device 7 determines whether processing by the wafer processing device 8 has finished, and if there are wafers 4 whose processing is not finished inside the container main body 2b, returns to step S17, while if processing by the wafer processing device 8 has finished, in step S21 the load port 12 control device the stage 3 by operating the linear motion mechanism 9, thereby retracting the container main body 2b to the standby position as shown in FIG. 12D and FIG. 16C.

Figure 14A:
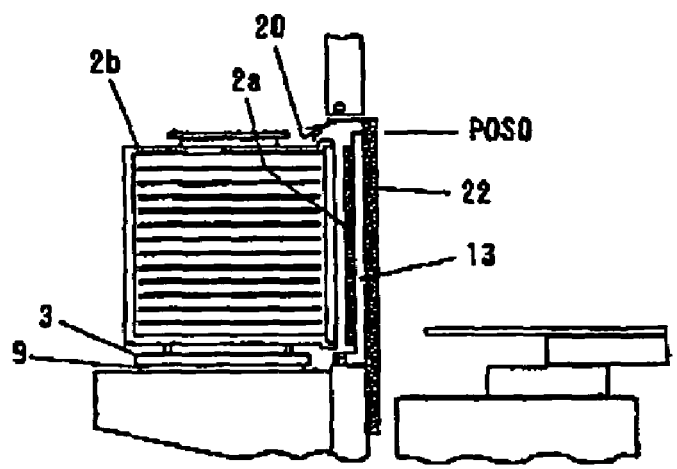
FIG. 14 is an explanatory drawing showing a vertical cross sectional view of the operating state of a wafer mapping device of an embodiment of the present invention and a load port of an embodiment of the present invention provided therewith, together with the operating state of a wafer conveying robot.
Figure 14B:
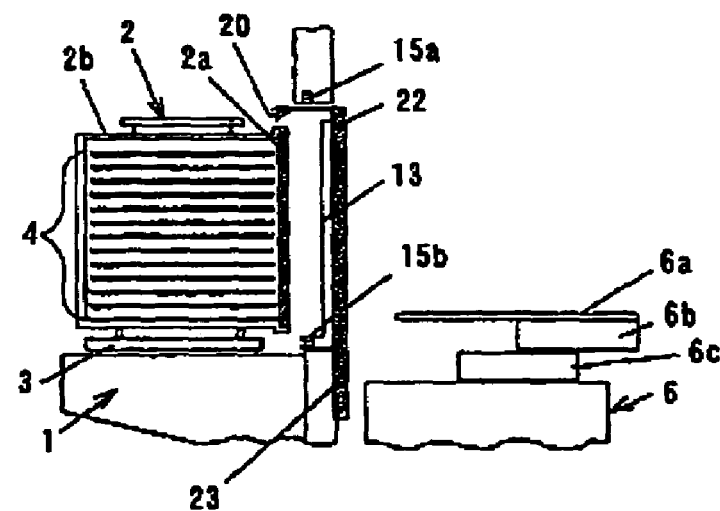

Subsequently, the load port 12 control device in step S22, raises the port door 13 in position POS3 to position POS0 (starting position) as shown in FIG. 14A, then in step S23 moves forward (extends) the stage 3 by opening the linear motion mechanism 9 to extend the port door 13 toward the container main body 2b and engage and make tightly contact the container main body 2b and the front door 4a tightly contacted to the port door 13, and subsequently in step S24 locks the front door 2a to the container main body 2b with the latch 2e by rotating the latch key 13b in the opposite direction to the rotation of step S2 in the latch key hole 2d, and finally in step S25 retracts the stage 3 to the staring position by operating the linear motion mechanism 9 and, as shown in FIG. 14B, retracts the clean container 2 in the direction away from the port door 13. By this means, the operation from conveyance of the wafers 4 by the wafer conveying robot 6 to the wafers being returned to the container main body 2b of the clean container 2 via the processing of the wafers 4 by the wafer processing device 8 is completed.

Although explained based on the examples in the drawings, the present invention is not limited to the above-described examples, and includes modifications that can be achieved by those skilled in the art within the scope of the claims.

INDUSTRIAL APPLICATION

According to the present invention, as well as eliminating the possibility of intrusion into the clean container of minute contaminants, light from a light emitting device can be made continuously accurately incident on a light receiving device over long periods of operation.

The invention claimed is:

1. A wafer mapping device for recognizing existence of wafers along with descending and opening of a front door of a closed type clean container for mounting and housing wafers on any one of or a plurality of shelves among a plurality of internal shelves in a state where the front door of the closed type clean container is made tightly contact to a port door of a load port, comprising:
    a swinging member coupled to the port door so as to swing around a predetermined horizontal axis extending below the port door and parallel to the port door;
    a pair of sensor portions fixed to the swinging member and mutually separated as well as protruding towards the clean container from the swinging member above the port door;
    a light emitting device and light receiving device fixed one each to the pair of sensor portions and facing each other; and
    swinging drive means for rotating the swinging member around the predetermined horizontal axis to an angle where the wafers enter between the light emitting device and the light receiving device without the light emitting device and the light receiving device contacting the wafers, and inserting the pair of sensor portions into the clean container.

2. The wafer mapping device according to claim 1, comprising projection detection means for detecting objects that project from a main body of the clean container, having a light emitting device fixed to one of a top part of the port door or adjacent member thereto and an under part of the port door or adjacent member thereto, and a light receiving device fixed to the other of a top part of the port door or adjacent member thereto and an under part of the port door or adjacent member thereto.

3. A load port that lowers and opens, in a state where it is tightly contacted to the port door, a front door of a closed type clean container that houses one or more wafers mounted on one or a plurality of shelves among a plurality of internal shelves, the load port comprising a wafer mapping device that, along with lowering of the front door in a state where it is tightly contacted to the port door, recognizes the existence of the wafer, characterized in that the wafer mapping device is that described in claim 1.

4. The load port according to claim 3, characterized in that the load port comprising for opening and closing the front door of the clean container:
    front door detachably fixing means for engaging/disengaging the front door with/from the main body of the clean container, and fixing the front door in a releasable tightly contacted state with the port door;
    container main body reciprocatingly moving means for advancing/retracting the main body of the container with respect to a window member of the frame of the load port; and
    port door elevating means for elevating the port door to which the front door is tightly contacted and fixed.

5. A load port that lowers and opens, in a state where it is tightly contacted to the port door, a front door of a closed type clean container that houses one or more wafers mounted on one or a plurality of shelves among a plurality of internal shelves, the load port comprising a wafer mapping device that, along with lowering of the front door in a state where it is tightly contacted to the port door, recognizes the existence of the wafer, characterized in that the wafer mapping device is that described in claim 2.

* * * * *